(12) United States Patent
Choi et al.

(10) Patent No.: US 8,711,624 B2
(45) Date of Patent: Apr. 29, 2014

(54) MEMORY DEVICE AND SELF INTERLEAVING METHOD THEREOF

(75) Inventors: Seonghyeog Choi, Hwaseong-si (KR); Hong Rak Son, Anyang-si (KR); Junjin Kong, Yongin-si (KR); Jaehong Kim, Seoul (KR); KyoungLae Cho, Yongin-si (KR); Yong June Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 133 days.

(21) Appl. No.: 13/236,249

(22) Filed: Sep. 19, 2011

(65) Prior Publication Data

US 2012/0069657 A1 Mar. 22, 2012

(30) Foreign Application Priority Data

Sep. 20, 2010 (KR) .................. 10-2010-0092583

(51) Int. Cl.
*G11C 11/34* (2006.01)

(52) U.S. Cl.
USPC ............ 365/185.09; 365/185.18; 365/185.23; 365/185.22

(58) Field of Classification Search
USPC ............ 365/185.09, 185.18, 185.03, 185.24, 365/185.33, 185.22, 230.03, 230.05
See application file for complete search history.

(56) References Cited

U.S. PATENT DOCUMENTS

| 6,684,289 | B1 | 1/2004 | Gonzalez et al. |
| 7,493,457 | B2 | 2/2009 | Murin |
| 7,522,451 | B2 | 4/2009 | Chen |
| 2005/0213393 | A1 | 9/2005 | Lasser |
| 2008/0147968 | A1* | 6/2008 | Lee et al. ..................... 711/103 |
| 2009/0182934 | A1 | 7/2009 | Kim et al. |
| 2010/0162065 | A1* | 6/2010 | Norman ........................ 714/746 |
| 2010/0238705 | A1* | 9/2010 | Kim et al. ..................... 365/148 |
| 2011/0075478 | A1* | 3/2011 | Yoon et al. ............... 365/185.03 |

FOREIGN PATENT DOCUMENTS

| JP | 2008-108408 A | 5/2008 |
| KR | 10-2007-0023174 A | 2/2007 |
| KR | 10-2009-0078285 A | 7/2009 |

* cited by examiner

*Primary Examiner* — Son Dinh
(74) *Attorney, Agent, or Firm* — Lee & Morse, P.C.

(57) ABSTRACT

A memory device includes a memory cell array, a self interleaver configured to interleave and load data on the fly into a buffer circuit using an interleaving scheme, and a control logic configured to control programming of the interleaved data in the memory cell array.

42 Claims, 23 Drawing Sheets

| State<br>Page | E | P1 | P2 | P3 | BER |
|---|---|---|---|---|---|
| Page1<br>(LSB) | 1 | 1 | 0 | 0 | 1 |
| Page2<br>(MSB) | 1 | 0 | 0 | 1 | 2 |

Fig. 7

| State\Page | E | P1 | P2 | P3 | P4 | P5 | P6 | P7 | P8 | P9 | P10 | P11 | P12 | P13 | P14 | P15 | BER |
|---|---|---|---|---|---|---|---|---|---|---|---|---|---|---|---|---|---|
| Page1 | 1 | 1 | 1 | 1 | 1 | 1 | 1 | 1 | 0 | 0 | 0 | 0 | 0 | 0 | 0 | 0 | 1 |
| Page2 | 1 | 1 | 1 | 1 | 0 | 0 | 0 | 0 | 0 | 0 | 0 | 0 | 1 | 1 | 1 | 1 | 2 |
| Page3 | 1 | 1 | 0 | 0 | 0 | 0 | 1 | 1 | 1 | 1 | 0 | 0 | 0 | 0 | 1 | 1 | 4 |
| Page4 | 1 | 0 | 0 | 1 | 1 | 0 | 0 | 1 | 1 | 0 | 0 | 1 | 1 | 0 | 0 | 1 | 8 |

MEMORY DEVICE AND SELF INTERLEAVING METHOD THEREOF

CROSS-REFERENCE TO RELATED APPLICATIONS

This U.S. non-provisional patent application claims priority under 35 U.S.C. §119 of Korean Patent Application No. 10-2010-0092583, filed on Sep. 20, 2010, the entire contents of which are hereby incorporated by reference.

BACKGROUND

The present disclosure herein relates to a semiconductor memory and, more particularly, to a memory device using an interleaving scheme.

Typically, semiconductor memory devices are classified into volatile memories such as Dynamic Random Access Memories (DRAMs) and Static Random Access Memories (SRAMs) and nonvolatile memories such as Electrically Erasable Programmable Read-Only Memories (EEPROMs), Ferroelectric Random Access Memories (FRAMs), Phase change Random Access Memories (PRAMs), Magnetoresistive Random Access Memories (MRAMs) and flash memories. Nonvolatile memories lose stored data when power supply is stopped, but nonvolatile memories retain stored data even when power supply is stopped. Particularly, flash memories have advantages of high programming speed, low power consumption, and large-capacity data storage. Accordingly, flash memory systems including flash memories are being widely used as data storage media.

Flash memories may store 1-bit data or 2 or more-bit data in one memory cell. Typically, a memory cell storing 1-bit data is called a single level cell (SLC) and a memory cell storing 2 or more-bit data is called a multi level cell (MLC). The SLC has an erase state and a program state according to a threshold voltage. The MLC has an erase state and a plurality of program states according to a threshold voltage.

In a flash memory having a multi level cell (hereinafter, referred to an MLC flash memory, a plurality of logical pages may be stored in memory cells (hereinafter, referred to as a physical page) sharing one word line. Here, each logical page may have a different bit error rate (BER). If it is assumed that the number of fail bits is identical in each reading level, an N-bit MLC flash memory may have a BER of $1:2:2^2:\ldots:2^{N-1}$ in each logical page.

SUMMARY

Example embodiments provide memory devices. The memory device may include a memory cell array, a self interleaver configured to interleave and load data on the fly into a buffer circuit using an interleaving scheme, and a control logic configured to control programming of the interleaved data in the memory cell array.

In some embodiments, the control logic may include the self interleaver.

In some embodiments, data may be received from outside the memory device.

In some embodiments, the memory cell array may include a plurality of physical pages each capable of storing a plurality of logical pages, the self interleaver may be configured to divide each logical page into a plurality of sectors and to perform the interleaving scheme by mixing sectors of the respectively different logical pages, and the control logic may control programming of the plurality of intermixed logical pages in a physical page of the memory cell array.

In some embodiments, the buffer circuit may store data by sectors.

In some embodiments, the buffer circuit may include a plurality of page buffers storing the sectors in response to enable signals and selection signals output from the self interleaver.

In some embodiments, each page buffer may include a plurality of latches, each latch storing one bit in response to a corresponding enable signal and corresponding selection signals output from the self interleaver.

In some embodiments, the self interleaver may be configured to interleave and load data into the buffer circuit by sector unit.

In some embodiments, the memory device may include a column selection circuit selecting a page buffer of the buffer circuit, and a data buffer providing data received from outside the memory device into the column selection circuit.

In some embodiments, the self interleaver may be configured to control the buffer circuit and the column selection circuit to interleave and load data.

In some embodiments, data may be from a source page of the memory cell array and the control logic may be configured to control programming of the interleaved data to a target page in the memory cell array using interleaving.

In some embodiments, the self interleaver may be configured to sequentially store n-bit data from the source page in a first page buffer of the buffer circuit, to transfer the source page data to a data buffer, and to interleave and load the source page data on the fly into n latches from the first page buffer.

In some embodiments, the self interleaver may be configured to store data from the source page in the buffer circuit, to transfer the source page data to a circuit external to the memory device, the circuit further processing the source page data, and to interleave and load the source page data on the fly from the external circuit into the buffer circuit, and to control programming of the interleaved data to the target page of the memory cell array.

In other embodiments, the self interleaver may be configured to store data from the source page and data from outside the memory device in the buffer circuit, and to interleave and load the source page data and the data from outside on the fly into the buffer circuit, and to control programming of the interleaved data to the target page of the memory cell array.

In some embodiments, the plurality of logical pages stored in the buffer circuit may be programmed by an all state simultaneous program scheme.

In some embodiments, the self interleaver may be configured to determine a size of an individual sector.

In some embodiments, interleaved data may have a bit error rate equal to an average bit error rate of the plurality of sectors.

In some embodiments, each physical page may be divided into a main area and a spare area.

In some embodiments, the memory cell array may have a three-dimensional structure.

In some embodiments, the memory cell array may be a flash memory cell array.

Example embodiments provide memory systems. The memory system may include a memory device according to embodiments and a memory controller controlling an operation of the memory device.

In some embodiments, the memory system may be a system on chip.

In some embodiments, the memory system may include an error correction code circuit.

In some embodiments, the error correction code circuit may be part of the memory controller.

In other embodiments, the error correction code circuit may be separate from the memory controller.

In some embodiments, the error correction code circuit may be designed for an average bit error rate of logical pages to be stored in the memory cell array.

In some embodiments, the memory system may include a host, and a communication device configured to exchange data between the host and the memory device.

In some embodiments, the memory system may include a plurality of memory devices.

In some embodiments, the memory device may be part of a memory card.

In some embodiments, the memory device may be part of a solid state drive.

In some embodiments, the memory device may be a flash memory device.

Example embodiments provide electronic devices including a memory system according to embodiments.

Example embodiments provide methods of operating a memory device. The method may include receiving data, interleaving and loading received data on the fly into a buffer circuit using an interleaving scheme, and programming the interleaved data in a memory cell array of the memory device.

In some embodiments, receiving data may include receiving data from outside the memory device.

In other embodiments, receiving data may include receiving data from inside the memory device.

In some embodiments, receiving data may include receiving data from a source page of the memory cell array and programming may include programming the interleaved data to a target page in the memory cell array.

In some embodiments, receiving data may include receiving data from a source page of the memory cell array and receiving data from outside the memory device, wherein interleaving and loading includes mixing data from the source page and data from outside, wherein programming includes programming the interleaved data to a target page in the memory cell array.

In some embodiments, interleaving and loading may include determining a data size of a sector to be interleaved, dividing logical pages to be stored in the memory cell array into a plurality of sectors, and mixing sectors of different logical pages.

In some embodiments, a bit error rate of interleaved data may equal an average bit error rate of the plurality of sectors.

In some embodiments, the method may include, before programming, determining whether all data has been loaded into the buffer circuit.

In some embodiments, when all data has been loaded into the buffer circuit, programming may include using an all state simultaneous program scheme.

In some embodiments, when all data has not been loaded into the buffer circuit, the method may include repeating receiving, and interleaving and loading.

In some embodiments, the method may be used with a flash memory cell array.

BRIEF DESCRIPTION OF THE DRAWINGS

The above and other features and advantages will become more apparent to those of ordinary skill in the art by describing in detail exemplary embodiments with reference to the attached drawings, in which:

FIGS. 4 through 7 illustrate threshold voltage distributions of the memory cells of FIG. 3;

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

I. Flash Memory System Including Self Interleaver

Figure 1:
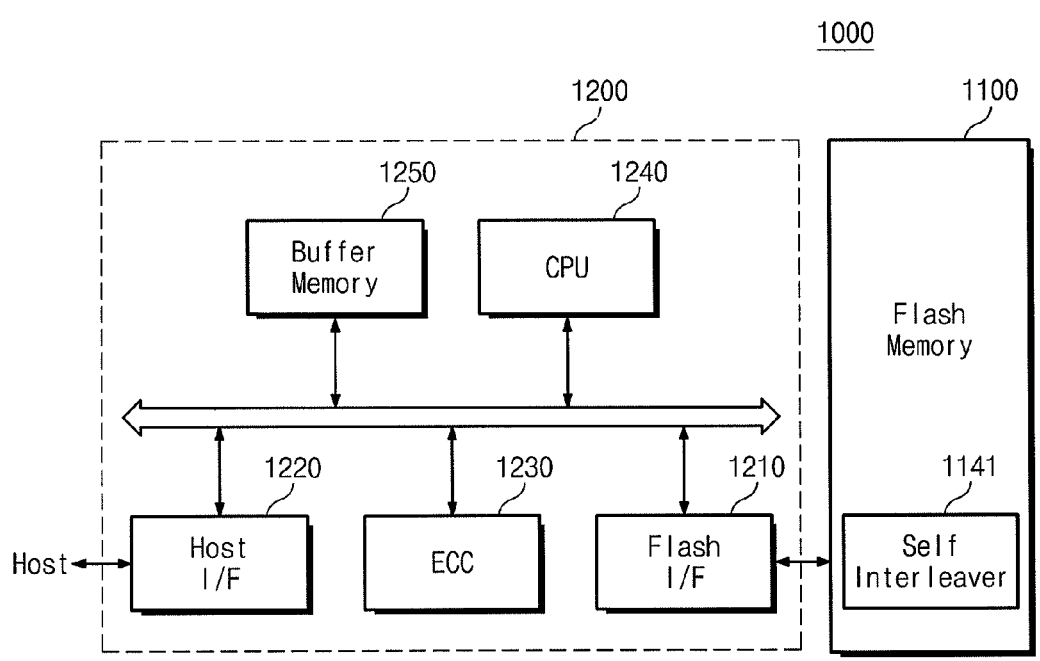
FIG. 1 illustrates a block diagram of a memory system according to an embodiment.

FIG. 1 illustrates a block diagram of a memory system according to an embodiment. Referring to FIG. 1, the memory system 1000 may include a flash memory 1100 and a memory controller 1200.

The flash memory 1100 and the memory controller 1200 may be included in one storage device. The storage device may include a USB memory, a memory card, a solid state drive (SSD), and so forth. Additionally, the storage device may be connected to a host (not shown), e.g., a computer, a notebook, a digital camera, a mobile phone, an MP3 player, a PMP, a game console, and so forth, and then may be utilized.

The flash memory 1100 may perform an erase, write, or read operation according to a control of the memory controller 1200. Referring to FIG. 1, the flash memory 1100 may include a self interleaver 1141. The flash memory 1100 may perform an interleaving operation by itself using the self interleaver 1141. An internal configuration and operations of the flash memory 1100 will be described in more detail with reference to FIG. 2.

Referring still to FIG. 1, the memory controller 1200 may include a flash interface 1210, a host interface 1220, an error correction code (ECC) circuit 1230, a central processing unit (CPU) 1240, and a buffer memory 1250. The memory controller 1200 may store data input from a host (not shown) to the flash memory 1100 and may provide data read from the flash memory 1100 to the host.

The flash interface 1210 may be used to exchange a command, an address, and data with the flash memory 1100. That is, the flash interface 1210 may provide a read command and address during a read operation and may provide a write command, address, and data during a write operation. The host interface 1220 may be used to receive a request, e.g., write or read, from a host and provide data in response to the request of the host.

The ECC circuit 1230 may generate parity bits using data to be stored in the flash memory 1100. The parity bits, in addition to data, are stored in the flash memory 1100. The number of bit errors that the ECC circuit 1230 can correct using an ECC is limited. For example, a 1-bit ECC engine may correct only 1-bit error, a 2-bit ECC engine may correct only 2-bit error, and so forth. Generally, as the number of correctible bit errors increases, overhead of the ECC circuit increases.

The ECC circuit 1230 may detect and correct an error of data read from the flash memory 1100 using parity bits stored in the flash memory 1100. The error detection and correction technique allows data damaged by various factors to be effectively restored. Various methods are used for the error detection and correction technique, e.g., a Reed-Solomon (RS) code, a Hamming code, a Bose-Chaudhuri-Hocquenghem (BCH) code, a Cyclic Redundancy Code (CRC), and so forth. Moreover, the ECC circuit 1230 may be positioned inside or outside the memory controller 1200 according to a structure of the memory system 1000.

The ECC circuit 1230 may generate parity bits using an ECC encoder (not shown), and corrects an error and restores data using an ECC decoder (not shown). The ECC circuit 1230 may perform a parity encoding or decoding operation by a predetermined data unit (hereinafter, referred to as a code word).

The CPU 1240 may control read, write, and erase operations of the flash memory 1100 in response to a request of a host.

The buffer memory 1250 may temporarily store data read from the flash memory 1100 or data provided from a host. Additionally, the buffer memory 1250 may be used for driving firmware, e.g., a Flash Translation Layer (FTL).

Moreover, the buffer memory 1250 may store table information necessary for managing read error information. This table information may be stored as meta data in a meta region of the flash memory 1100 under a control of the CPU 1240. This table information is copied from the meta region into the buffer memory 1250 during power up. Although not shown in the drawings, the memory system 1000 may further include ROM for storing code data to interface with a host.

Figure 2:
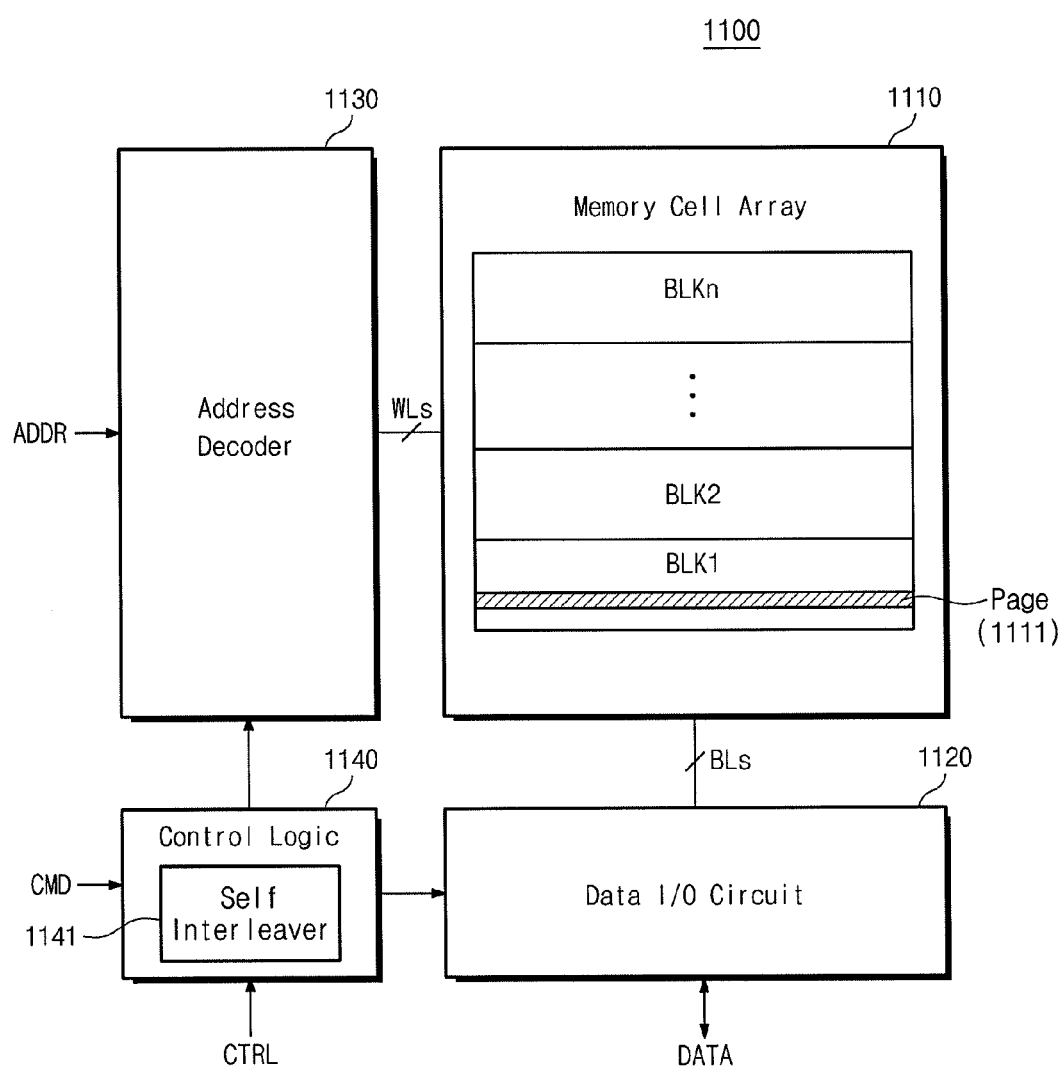
FIG. 2 illustrates a block diagram of the flash memory of FIG. 1.

FIG. 2 illustrates a block diagram of the flash memory 1100 of FIG. 1. Referring to FIG. 2, the flash memory 1100 includes a memory cell array 1110, a data input/output circuit 1120, an address decoder 1130, and a control logic 1140.

The memory cell array 1110 may include a plurality of memory blocks BLK1 to BLKn. Each memory block consists of a plurality of pages. Each page (e.g., 1111) consists of a plurality of memory cells. The flash memory may 1100 perform an erase operation by a memory block unit and may perform a write or read operation by a page unit.

The data input/output circuit 1120 is connected to the memory cell array 1110 through a plurality of bit lines BLs. The data input/output circuit 1120 is used for receiving program data and delivering them to a selected page or outputting data read from the selected page 1111.

The address decoder 1130 is connected to the memory cell array 1110 through the plurality of word lines WLs. The address decoder 1130 receives an address ADDR and selects a memory block or page. Here, an address for selecting a memory block is designated as a block address and an address for selecting a page is designated as a page address.

The control logic 1140 may perform program, read, and erase operations according to a control signal CTRL provided from the memory controller 1200. Referring to FIG. 2, the control logic 1140 may include a self interleaver 1141. The self interleaver 1141 may perform an interleaving operation by itself, being separate from the memory controller 1200 of FIG. 1. The self interleaver 1141 may be realized with hardware, e.g., a module, and/or software, e.g., an algorithm. In addition, the self interleaver 1141 may be positioned outside the control logic 1140.

Figure 3:
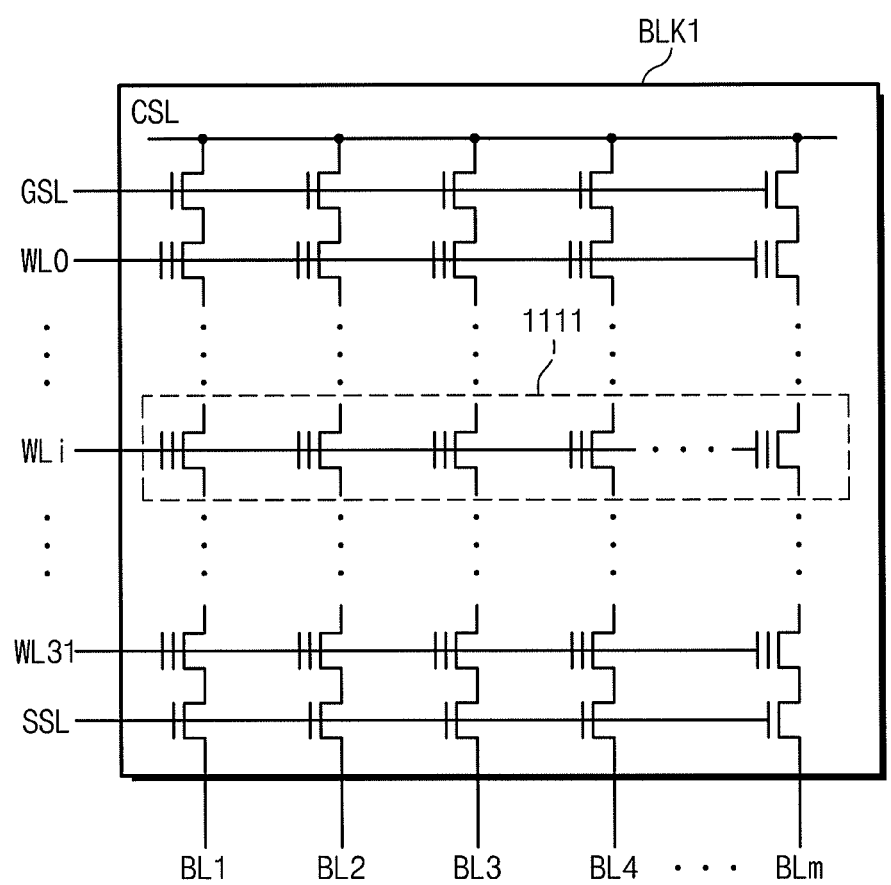
FIG. 3 illustrates a circuit diagram of the memory block BLK1 of FIG. 1.

FIG. 3 illustrates a circuit diagram of the memory block BLK1 of FIG. 2. Referring to FIG. 3, the memory block BLK1 has a cell string structure. One cell string includes a string selection transistor, a plurality of memory cells, and a ground selection transistor.

The string selection transistor is connected to a String Selection Line SSL, the plurality of memory cells are connected to a plurality of word lines WL0 to WL31, and the ground selection transistor is connected to a Ground Selection Line GSL. The string selection transistor is connected to bit lines BL1 to BLm and the ground selection transistor is connected to a Common Source Line CSL.

A plurality of memory cells may be connected to one word line (e.g., WLi). A set of the memory cells connected to one word line is called a physical page. One physical page may be divided into a main area for storing main data and a spare area for storing additional data such as parity bits.

Single bit data or multi bit data, i.e., data of two or more bits, may be stored in one memory cell. A memory cell storing single bit data is called a single level cell (SLC) and a memory cell storing multi bit data is called a multi level cell (MLC) or a multi bit cell.

The SLC has an erase state and a program state according to a threshold voltage. The MLC has an erase state and a plurality of program states according to a threshold voltage. The flash memory 1100 may have single level cells and multi level cells simultaneously.

A 2-bit MLC flash memory may store two logical pages in one physical page. Here, the logical page refers to a set of data programmable simultaneously in one physical page. A three-bit MLC flash memory device may store three logical pages in one physical page, and a four-bit MLC flash memory may store four logical pages in one physical page.

Figures 4, 5:
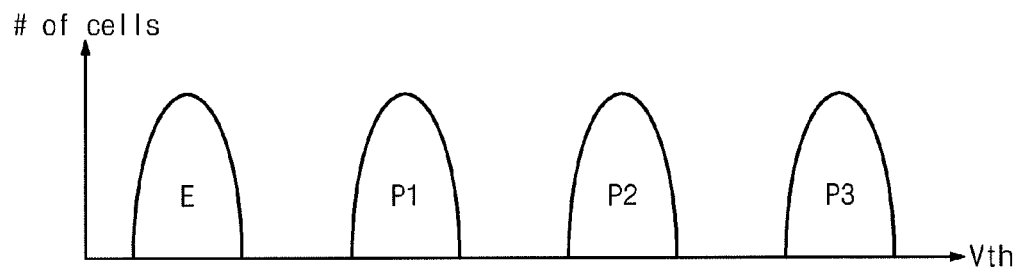

FIGS. 4 through 7 illustrate threshold voltage distributions of the memory cells of FIG. 3. More particularly, FIGS. 4 and 5 exemplarily illustrate a threshold voltage distribution of memory cells where 2-bit data are stored in one memory cell. In FIG. 4, the horizontal axis represents a threshold voltage Vth and the vertical axis represents the number of memory cells (# of cells). The memory cell may have one of four states E, P1, P2, and P3 according to a threshold voltage distribution. Here, E represents an erase state and P1, P2, and P3 represent program states.

When 2-bit data is to be stored, a memory cell has four states. Referring to FIG. 5, a first logical page (or LSB) and a second logical page (or MSB) may be stored in one physical page 1111 of FIG. 3. A memory cell having an E state stores (11), a memory cell having P1 stores (10), a memory cell having P2 stores (00), and a memory cell having P3 stores (01).

The flash memory 1100 may have a different bit error rate (BER) in each logical page. As a logical page increases, a BER is increased by a factor of two. For example, if the number of fail bits is identical in each reading level, the BER of the first logical page LSB is 1 and the BER of the second logical page MSB is 2. If N-bit data is stored in one memory cell, the BER for each of N logical pages is $1:2:2^2:\ldots:2^{N-1}$.

Figure 6:
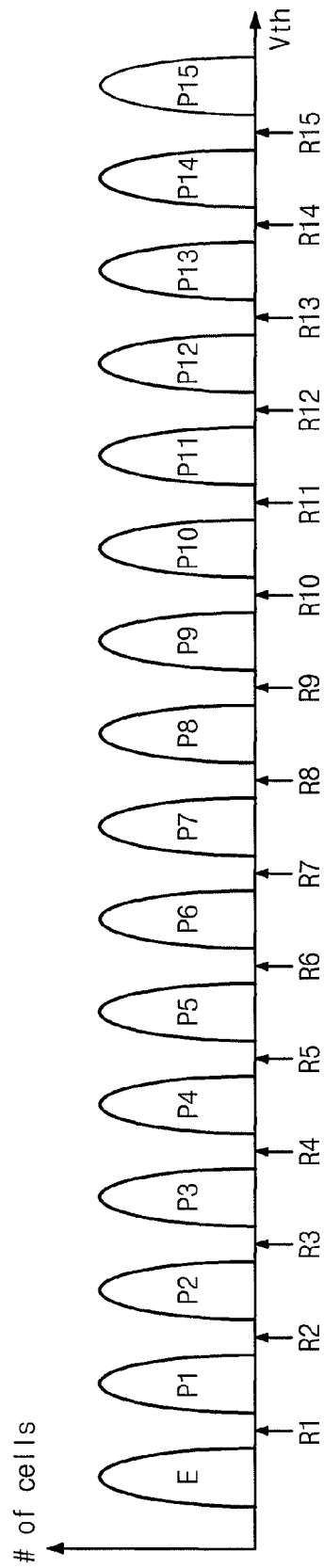

FIGS. 6 and 7 illustrate a threshold voltage distribution of memory cells where O-bit data are stored in one memory cell. Referring to FIG. 6, a memory cell may have one of sixteen states E, P1, P2, ... P15 according to a threshold voltage distribution. Here, E represents an erase state and P1 through P15 represent program states. In FIG. 6, R1 through R15 are read voltage levels for reading each state.

Referring to FIG. 7, first to fourth logical pages may be stored in one physical page 1111 of FIG. 3. A memory cell having an E state may store (1111), a memory cell having a P1 state may store (1110), a memory cell having a P2 state may store (1100), and a memory cell having a P15 state may store (0111).

Moreover, if it is assumed that the number of fail bits is identical in each reading level, the BER of the first logical page is 1, the BER of the second logical page is 2, the BER of the third logical page is 4, and the BER of the fourth logical page is 8.

Referring to FIG. 1 again, the memory system 1000 may include an ECC circuit 1230 for correcting a bit error of the flash memory 1100. The ECC circuit 1230 may improve reliability of the flash memory 1100 by detecting and correcting a bit error. If the flash memory 1100 stores N-bit data in one memory cell, a correctible range of the ECC circuit 1230 is set to the $N^{th}$ logical page having the worst BER. For example, if 4-bit data is stored in one memory cell, a correctible range of the ECC circuit 1230 is set to the fourth logical page.

BER disproportion of each logical page may be a factor increasing an overhead of the ECC circuit 1230. As the number of correctible bits increases, an area that the ECC circuit 1230 occupies increases. The flash memory 1100 of FIG. 2 according to an embodiment may average the BER of each logical page and may reduce an overhead of the ECC circuit 1230, by performing a self interleaving operation. Hereinafter, self interleaving methods of the flash memory 1100 will be described as exemplary embodiments.

II. Embodiments of Self Interleaving Method

1. Self Interleaving Method of 2-Bit MLC Flash Memory

Figure 8:
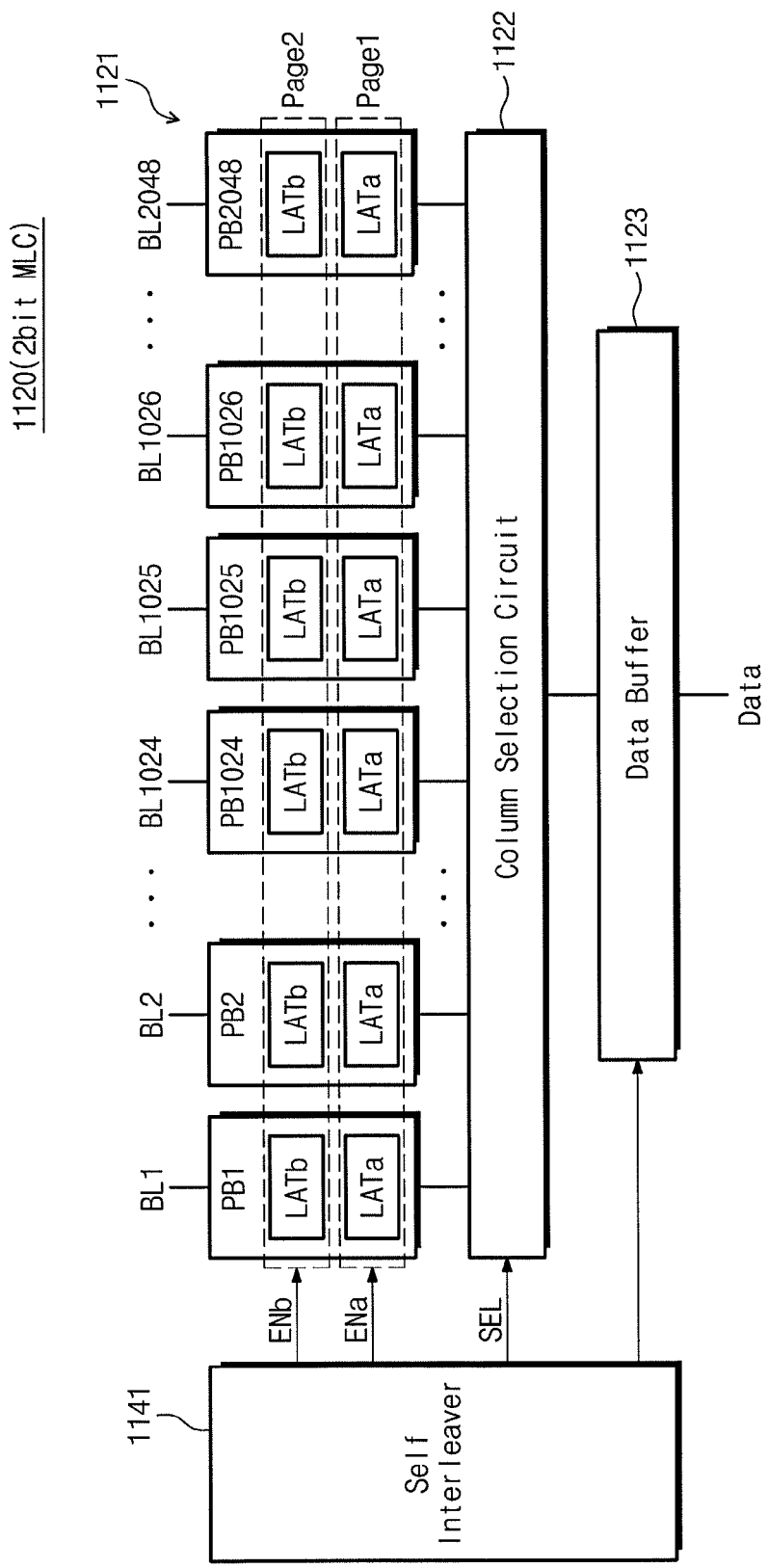
FIG. 8 illustrates a block diagram of a self interleaving operation of a 2-bit MLC flash memory.

FIG. 8 illustrates a block diagram of a self interleaving operation of a 2-bit MLC flash memory. Referring to FIG. 8, the data input/output circuit 1120 of FIG. 2 includes a page buffer circuit 1121, a column selection circuit 1122, and a data buffer 1123. The data input/output circuit 1120 may perform a self interleaving operation according to a control of the self interleaver 1141.

Referring still to FIG. 8, the page buffer circuit 1121 may include a plurality of page buffers PB1 to PB2048. Each page buffer is connected to each bit line and includes at least two latches LATa and LATb. A first logical page (page1) is stored in the LATa and a second logical page (page2) is stored in the LATb. The LATa and LATb are activated respectively in response to signals ENa and ENb.

The column selection circuit 1122 may select a bit line in response to a select signal SEL. Here, the select signal SEL may be start column address and address count signals. The start column address designates a page buffer that data begin to be stored and the address count designates the number of page buffers where data are to be stored. For example, if data are stored in first to $1024^{th}$ page buffers PB1 to PB1024, the start column address designates the first page buffer PB1 and the address count designates the number of pages, i.e., 1024.

The data buffer 1123 may receive data by a byte unit or word unit. The received data are stored in the page buffer circuit 1121 through the column selection circuit 1122. The data buffer 1123 may receive or output data DATA according to a control of the self interleaver 1141. In addition, the flash memory 1100 of FIG. 2 may be equipped with a data buffer for performing a self interleaving operation, being separated from the data buffer 1123 for input/output.

The self interleaver 1141 may perform a self interleaving operation by controlling the page buffer circuit 1121, the column selection circuit 1122, and the data buffer 1123. The self interleaver 1141 may perform an interleaving operation by an interleaving unit. Referring to FIG. 8, the first and second logical pages consist of 2408 bits. Each logical page may be divided into a plurality of interleaving units (IUs). Here, a sector is defined as the minimum unit by which an interleaving operation is performed. The sector may be diversely adjusted from 1-bit to n-bits (e.g., 8 bits, 512 bits, and 1024 bits).

The interleaving operation refers to an operation dividing a plurality of logical pages stored in one physical page 1111 of FIG. 3 by an IU and mixing them. The self interleaver 1141 may alleviate BER disproportion between logical pages by mixing a plurality of logical pages by an IU. That is, the self interleaver 1141 may reduce an overhead of the ECC circuit 1230 of FIG. 1 by averaging the BER between logical pages.

Figure 9:
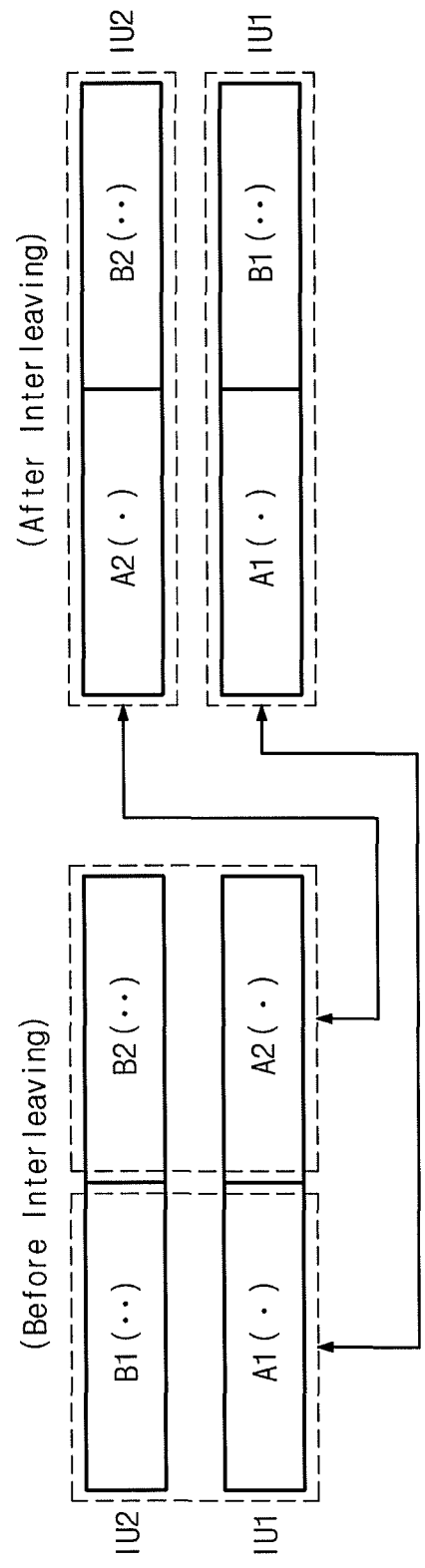
FIG. 9 illustrates a self interleaving operation of the 2-bit MLC flash memory of FIG. 8.

FIG. 9 illustrates a self interleaving operation of the 2-bit MLC flash memory of FIG. 8. Referring to FIGS. 8 and 9, the first logical page (page1) may be divided into a plurality of IUs and the first IU (IU1) consists of two sectors A1 and A2. For example, if the first logical page is 2048 bits and the first interleaving unit is 512 bits, each sector is 256 bits. In the same manner, the second logical page (page2) may be divided into a plurality of IUs and the second IU (IU2) consists of two sectors B1 and B2.

First, a code word configuration when no interleaving operation is performed will be examined. The first IU (IU1) includes the sectors A1 and A2 and the second IU (IU2) includes the sectors B1 and B2. At this point, since the first IU (IU1) is included in the first logical page (page 1), it has the BER of 1 and since the second IU (IU2) is included in the second logical page (page2), it has the BER of 2. In FIG. 9, BER is indicated as one or more dots in each sector. In this case, since the ECC circuit 1230 is designed to meet the BER of the second IU (IU2), without interleaving, the ECC circuit 1230 has an electrostatic capacity corresponding to the BER of 2.

Next, a code word configuration when an interleaving operation is performed will be examined. The sector A1 of the first logical page (page 1) and the sector B1 of the second logical page are mixed, thereby constituting the first IU (IU1). The first IU (IU1) is included in the first logical page and includes a sector A1 and a sector B1. In the same manner, the sector A2 and the sector B2 are mixed, there by constituting the second IU (IU2) finally. The second IU (IU2) is included in the second logical page and consists of the sector A2 and the sector B2. At this point, the BER of each of the first and second IUs (IU1, IU2) is 1.5, an average of 1 and 2. In this case, the ECC circuit 1230 has an electrostatic capacity corresponding to a reduced BER, e.g., a BER average value, i.e., 1.5.

As shown in FIG. 9, once the interleaving operation starts, since the ECC circuit 1230 has an electrostatic capacity of 1.5, an electrostatic capacity of the ECC circuit 1230 may be reduced by 0.5. The flash memory 1100 of FIG. 8 may divide the first and second logical pages into a plurality of IUs and mix them by a sector unit, such that a self interleaving operation may be performed. According to an embodiment, overhead of the ECC circuit 1230 may be reduced.

2. Self Interleaving Method of 4-Bit MLC Flash Memory

Figure 10:
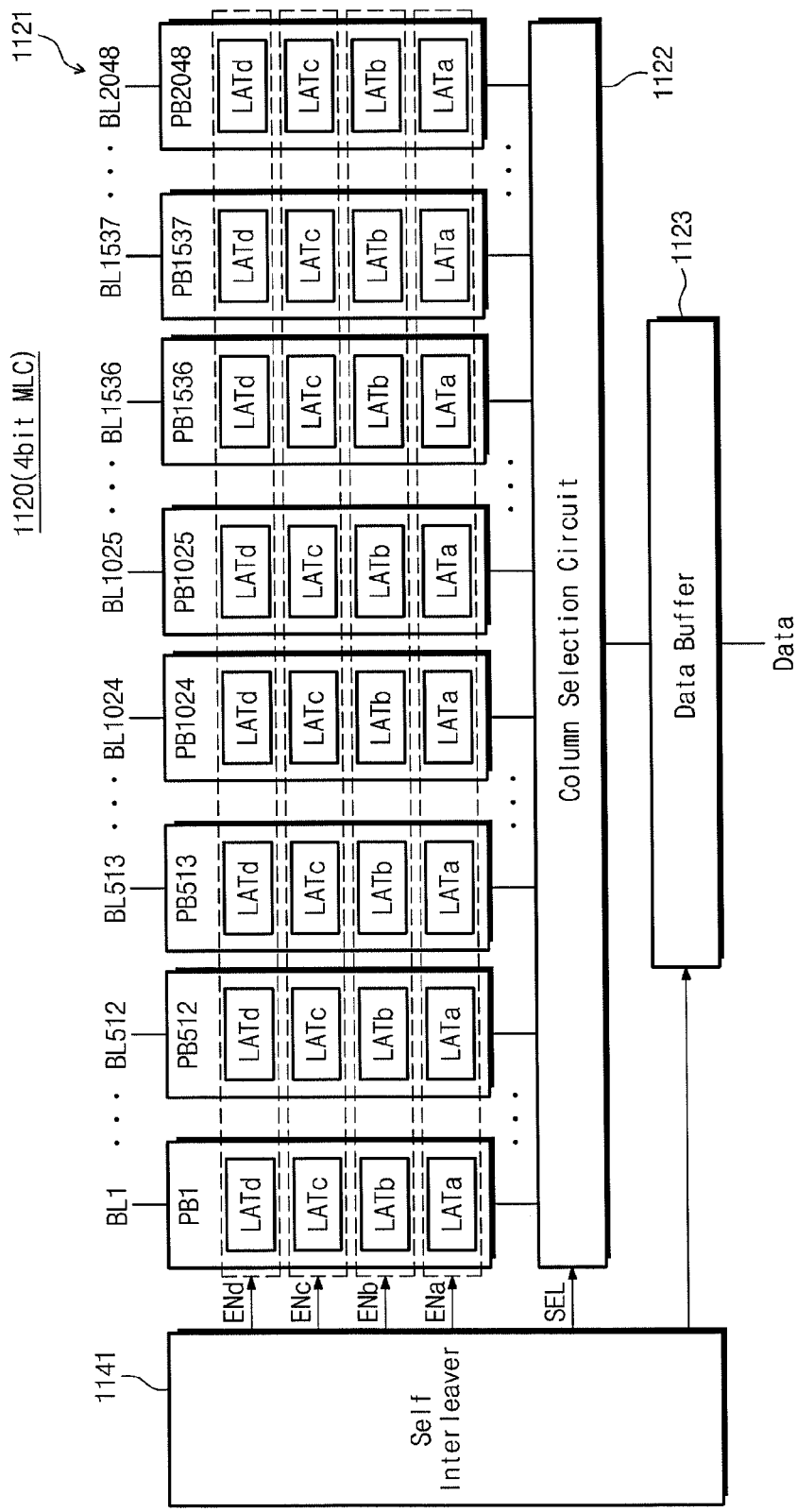
FIGS. 10 and 11 illustrate block diagrams of a self interleaving operation of a 4-bit MLC flash memory.

FIG. 10 illustrates a block diagram of a self interleaving operation of a 4-bit MLC flash memory. Referring to FIG. 10, the data input/output circuit 1120 of FIG. 2 may include a page buffer circuit 1121, a column selection circuit 1122, and a data buffer 1123. The data input/output circuit 1120 may perform an interleaving operation according to a control of the self interleaver 1141.

Referring to FIG. 10, the page buffer circuit 1121 consists of a plurality of page buffers PB1 to PB2048. Each page buffer includes at least four latches LATa and LATd. First to fourth logical pages are stored in the LATa to LATd, respectively. The LATa and LATd are activated respectively in response to signals ENa and ENd.

The column selection circuit 1122 may select a bit line in response to a select signal SEL. Here, the select signal SEL may be start column address and address count signals. The data buffer 1123 may receive data by byte unit, word unit, and so forth.

The self interleaver 1141 may performs a self interleaving operation by controlling the page buffer circuit 1121, the column selection circuit 1122, and the data buffer 1123. The self interleaver 1141 may store data in the LATa to LATd by activating the signals ENa to ENd. Moreover, the self interleaver 1141 may determine an IU or a sector size by providing the start column address and address count.

Figure 11:
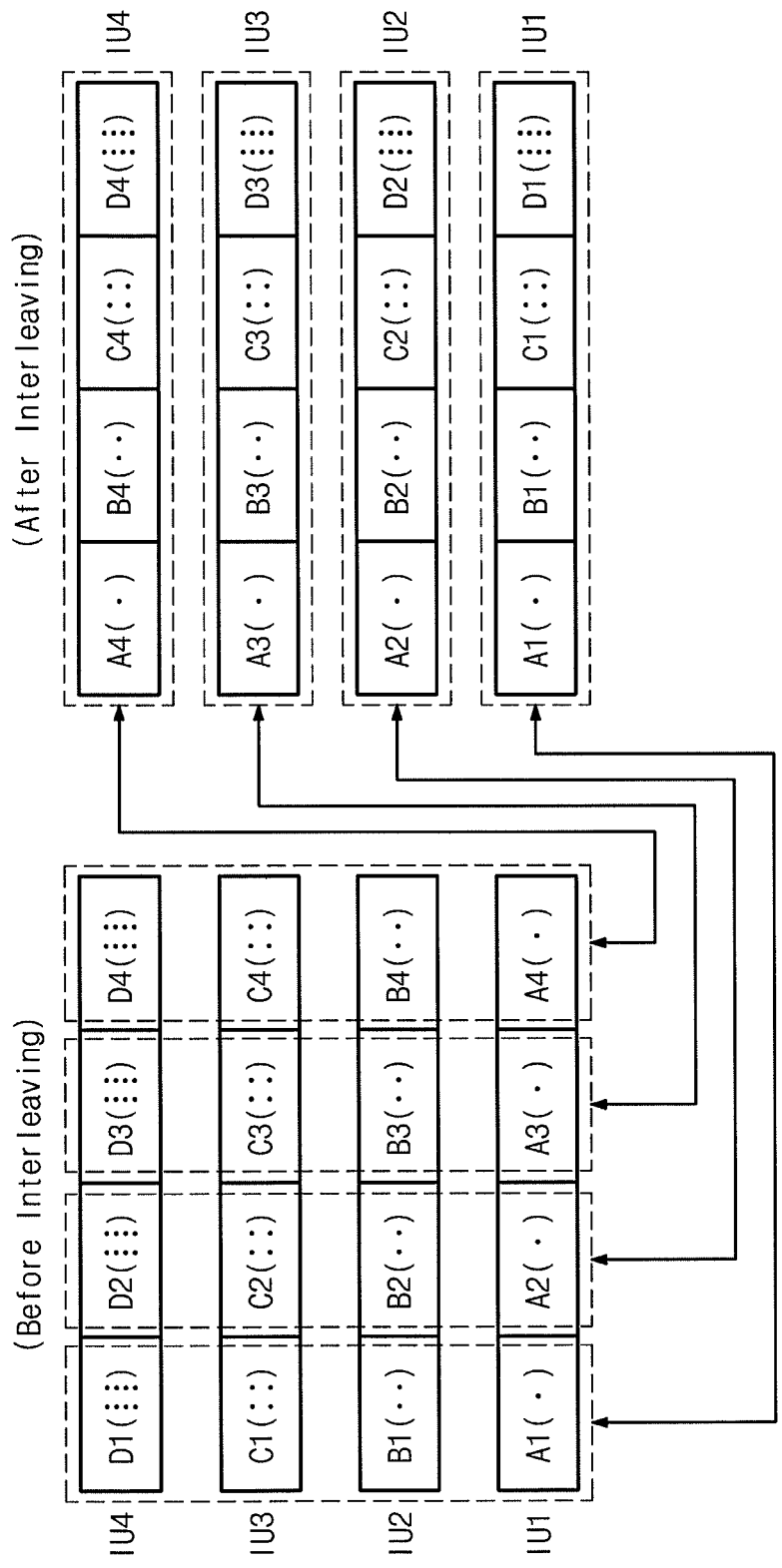

Referring to FIGS. 10 and 11, the first logical page (page1) may be divided into a plurality of IUs and the first IU (IU1) consists of four sectors A1 to A4. In the same manner, the second IU (IU2) consists of sectors B1 to B4, and the third IU (IU3) consists of sectors C1 to C4, and the fourth IU (IU4) consists of sectors D1 to D4. At this point, the first to fourth IUs IU1 to IU4 have the respective BERs of 1, 2, 4, and 8. In FIG. 11, BER is indicated with one or more dots in each sector. In this case, since the ECC circuit 1230 is designed to meet the highest BER of the sectors, i.e., of the fourth IU (IU4), the ECC circuit 1230 has an electrostatic capacity corresponding to the BER of 8.

In the self interleaver 1141, the sectors A1, B1, C1, and D1 are mixed, thereby constituting the first IU (IU1). That is, the first IU (IU1) consists of the sectors A1, B1, C1, and D1. In the same manner, the sectors A2, B2, C2, and D2 are mixed, thereby constituting the second IU (IU2); the sectors A3, B3, C3, and D3 are mixed, thereby constituting the third IU (IU1); and the sectors A4, B4, C4, and D4 are mixed, thereby constituting the fourth IU (IU4). At this point, each BER of the first to fourth IU (IU1~IU4) is 3.75, i.e., an average value across the original sectors before interleaving.

In this case, the ECC circuit 1230 needs to have an electrostatic capacity corresponding to the reduced BER value, here the average value of 3.75. As shown in FIG. 11, once the interleaving operation starts, since the ECC circuit 1230 requires an electrostatic capacity of 3.75, an electrostatic capacity of the ECC circuit 1230 may be reduced by 4.25.

Figure 12:
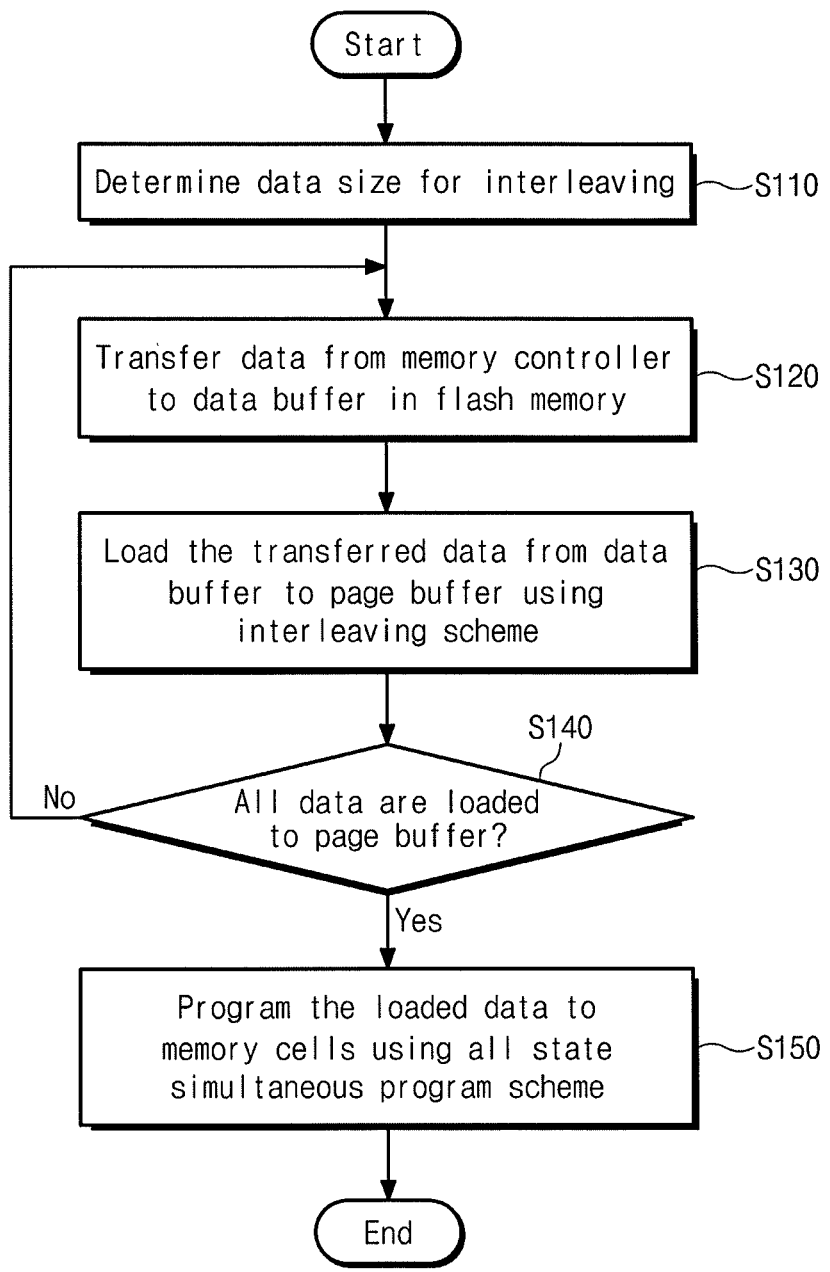
FIG. 12 illustrates a flowchart of a self interleaving operation of the memory system of FIG. 1.

FIG. 12 illustrates a flowchart of a self interleaving operation of the memory system 1000 of FIG. 1. Referring to FIG. 1, the memory system 1000 according to an embodiment may reduce BER disproportion between logical pages by performing a self interleaving operation. Hereinafter, a self interleaving operation of the memory system 1000 shown in FIG. 1 will be described.

In operation S110, the memory system 1000 of FIG. 1 determines a size of data that an interleaving operation is performed. The interleaving operation is performed by itself in the flash memory 1100 of FIG. 2 and a size of an IU may be provided from the memory controller 1200 of FIG. 1.

In operation S120, data are delivered from the memory controller 1200 to the data buffer 1123 of FIG. 8 of the flash memory 1100. In operation S130, the data are loaded from the data buffer 1123 to the page buffer circuit 1121 through the column selection circuit 1122. At this point, the flash memory 1100 mixes the data by each IU using interleaving described herein. In operation S140, it is determined whether all data are loaded into the page buffer. If all data are not loaded, operations S120 and S130 are repeated. If all data are loaded, the loaded data are programmed on a memory cell simultaneously using an all state simultaneous program scheme in operation S150. According to the self interleaving method of FIG. 12, BER disproportion between logical pages is reduced. Once the BER disproportion is alleviated, an electrostatic capacity of the ECC circuit may be reduced.

3. Copyback Self Interleaving Method Performed in Flash Memory

Figure 13:
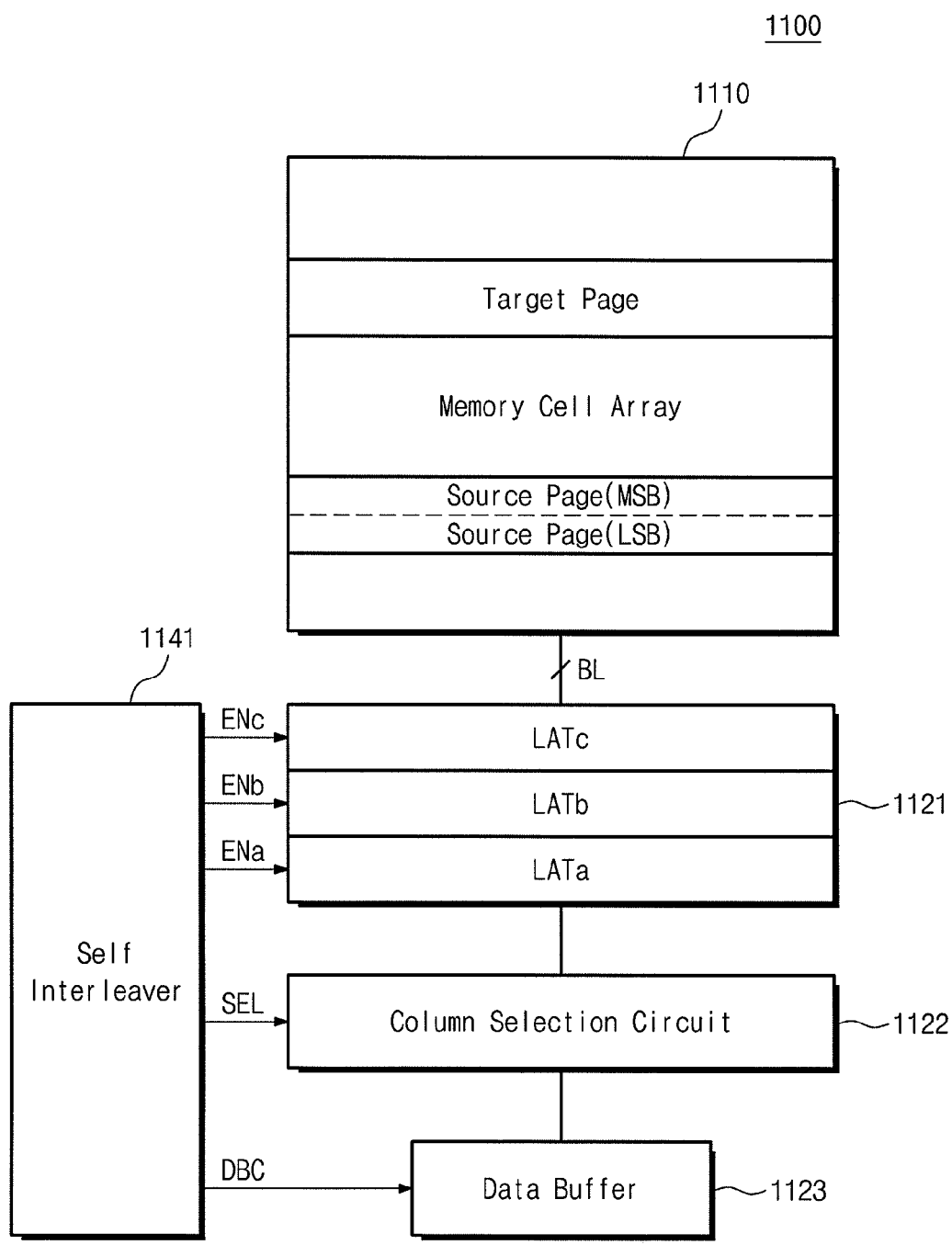
FIG. 13 illustrates a block diagram of a copyback self interleaving operation of the flash memory of FIG. 1.

FIG. 13 illustrates a block diagram of a copyback self interleaving operation of the flash memory of FIG. 1. The flash memory 1100 according to an embodiment may perform a copyback operation through a self interleaving method. The copyback operation refers to an operation transferring data stored in a source page of a flash memory into a target page.

Referring to FIG. 13, the flash memory 1100 includes a memory cell array 1110, a page buffer circuit 1121, a column selection circuit 1122, a data buffer 1123, and a self interleaver 1141. The flash memory 1100 shown in FIG. 13 may perform a copyback operation through a self interleaving method without an additional overhead of the ECC circuit 1230 of FIG. 1.

In FIG. 13, it is assumed that the first and second logical pages MSB and LSB stored in a source page of the memory cell array 1110 are copied back into a target page. In order to perform a copy operation, each page buffer (not shown) in the page buffer circuit 1121 may include at least three latches, e.g., LATa, LATb, and LATc. The latches LATa, LATb, and LATc are activated in response to signals ENa, ENb, and ENc, respectively. The self interleaver 1141 generates signals ENa, ENb, ENc, SEL, and DBC to control the page buffer circuit 1121, the column selection circuit 1122, and the data buffer 1123.

Figure 14:
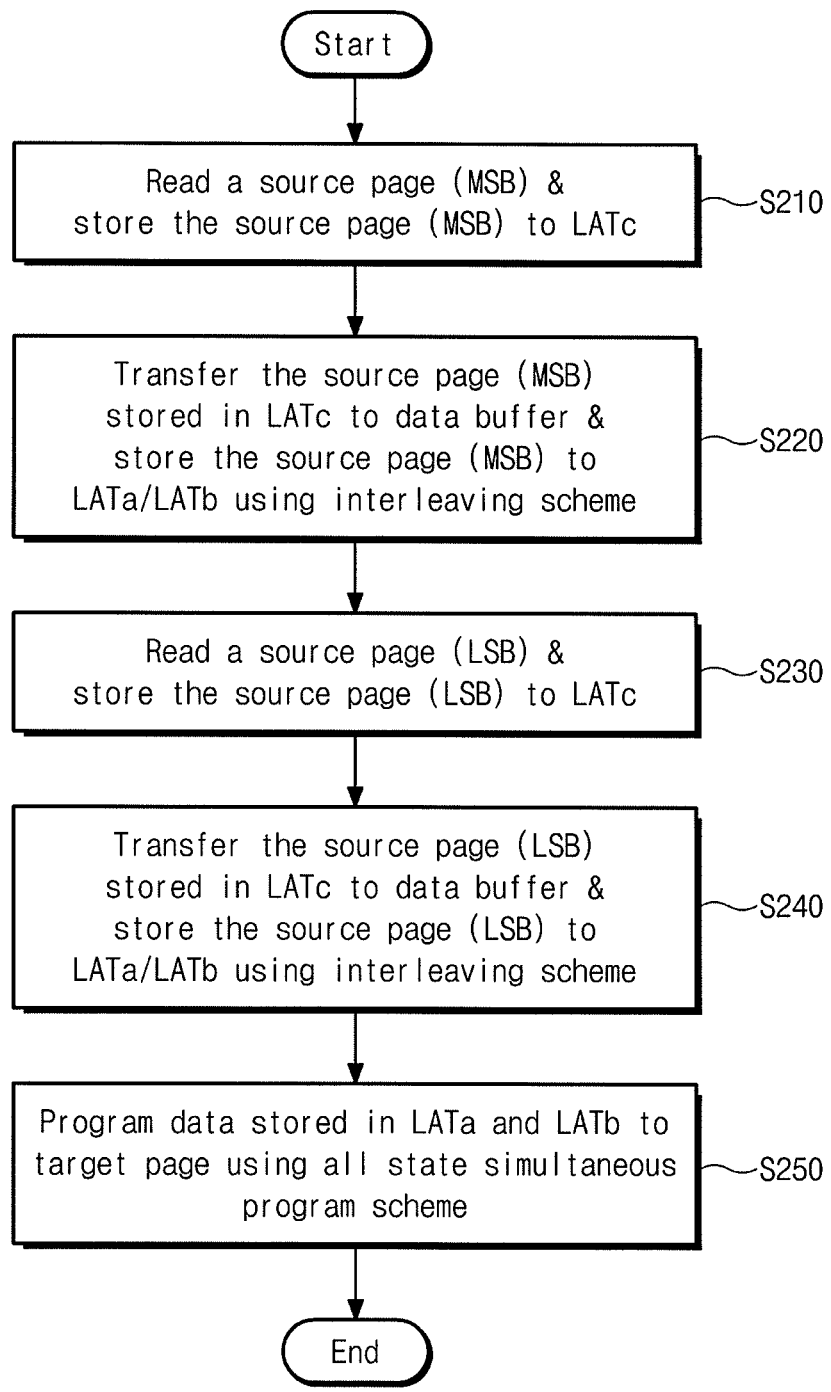
FIG. 14 illustrates a flowchart of a copyback self interleaving operation of the flash memory of FIG. 13.

FIG. 14 illustrates a flowchart of a copyback self interleaving operation of the flash memory of FIG. 13. Referring to FIGS. 13 and 14, a copyback self interleaving operation of the flash memory 1100 will be described.

In operation 5210, the flash memory 1100 reads MSB data of a source page and stores them in the latch LATc. The self interleaver 1141 activates the signal ENc to store MSB data in the latch LATc.

In operation S220, the MSB data stored in the latch LATc are delivered to the data buffer 1123. At this point, the MSB data may be divided by a sector unit and stored in the latches LATa and LATb using an interleaving scheme. The interleaving may be performed as described in FIGS. 8 and 9. The self interleaver 1141 may store the MLB data in the latches LATa and LATb through the column selection circuit 1122 and the data buffer 1123 by using the control signals ENa, ENb, ENc, SEL, and DBC.

In operation S230, the LSB data of a source page are read and stored in the latch LATc. In operation S240, the LSB data stored in the latch LATc are delivered to the data buffer 1123, are divided by a sector unit, and are stored in the latches LATa and LATb using an interleaving scheme. At this point, according to the self interleaver 1141, in response to the control signals ENa, ENb, ENc, SEL, and DBC, the LSB data stored in the latch LATc are divided and stored in the latches LATa and LATb through the column selection circuit 1122 and the data buffer 1123. In operation S250, the data stored in the latches LATa and LATb are programmed on a memory cell simultaneously using an all state simultaneous program scheme.

4. Copyback Self Interleaving Method Using Buffer Memory

Figure 15:
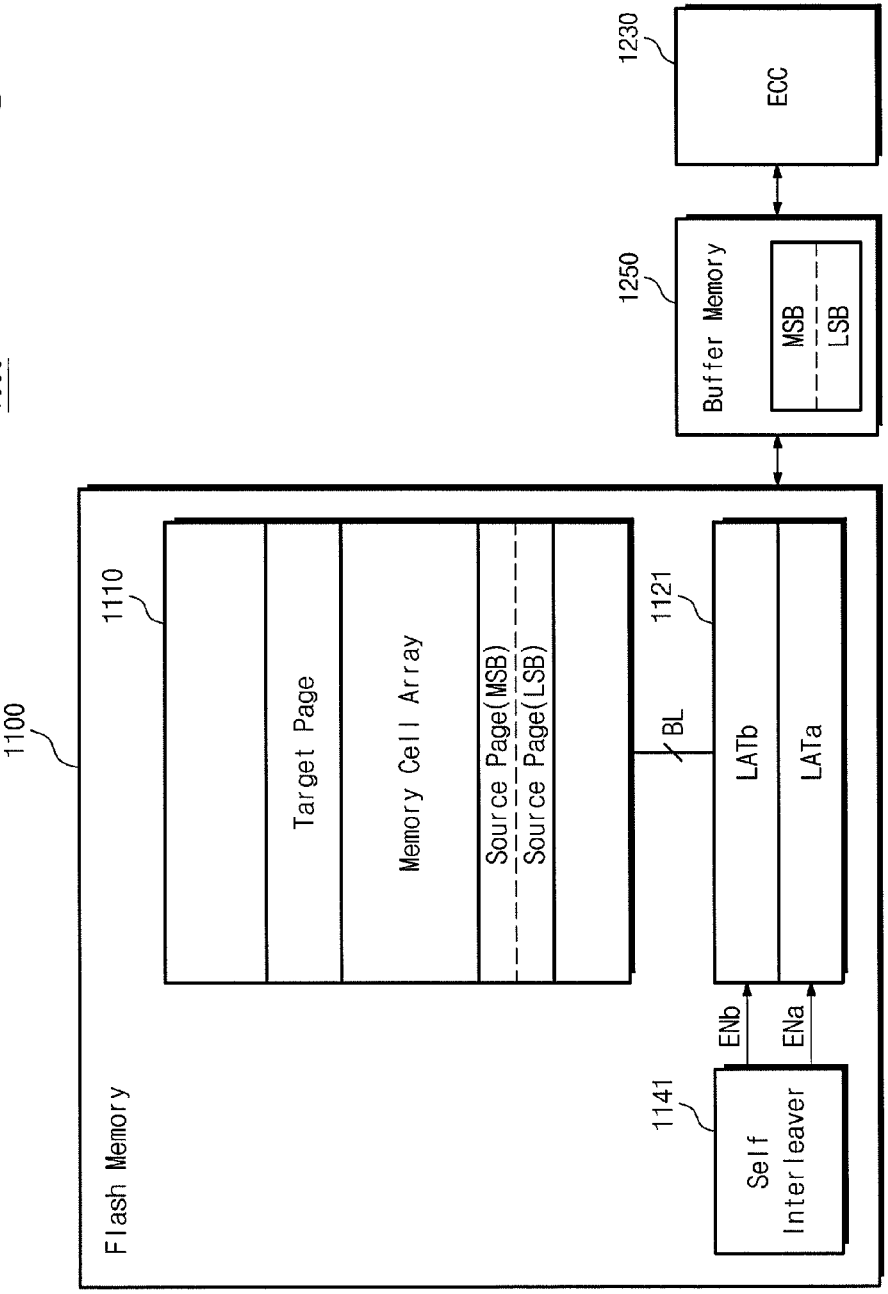
FIG. 15 illustrates a block diagram of a memory system performing a copyback self interleaving operation.

FIG. 15 illustrates a block diagram of a memory system performing a copyback self interleaving operation. Referring to FIG. 15, the memory system 1000 includes a flash memory 1110, an ECC circuit 1230, and a buffer memory 1250. The flash memory 1110 includes a memory cell array 1110, a page buffer circuit 1121, and a self interleaver 1141. A copyback operation of the flash memory 1100 may be performed using the buffer memory 1250.

In FIG. 15, it is assumed that the first and second logical pages MSB and LSB stored in a source page of the memory cell array 1110 are copied back into a target page. In order for performing a copyback operation, each page buffer (not shown) in the page buffer circuit 1121 requires at least two latches LATa and LATb. The latches LATa and LATb are activated in response to signals ENa and ENb, respectively. The self interleaver 1141 generates the signals ENa and ENb to control the page buffer circuit 1121.

Figure 16:
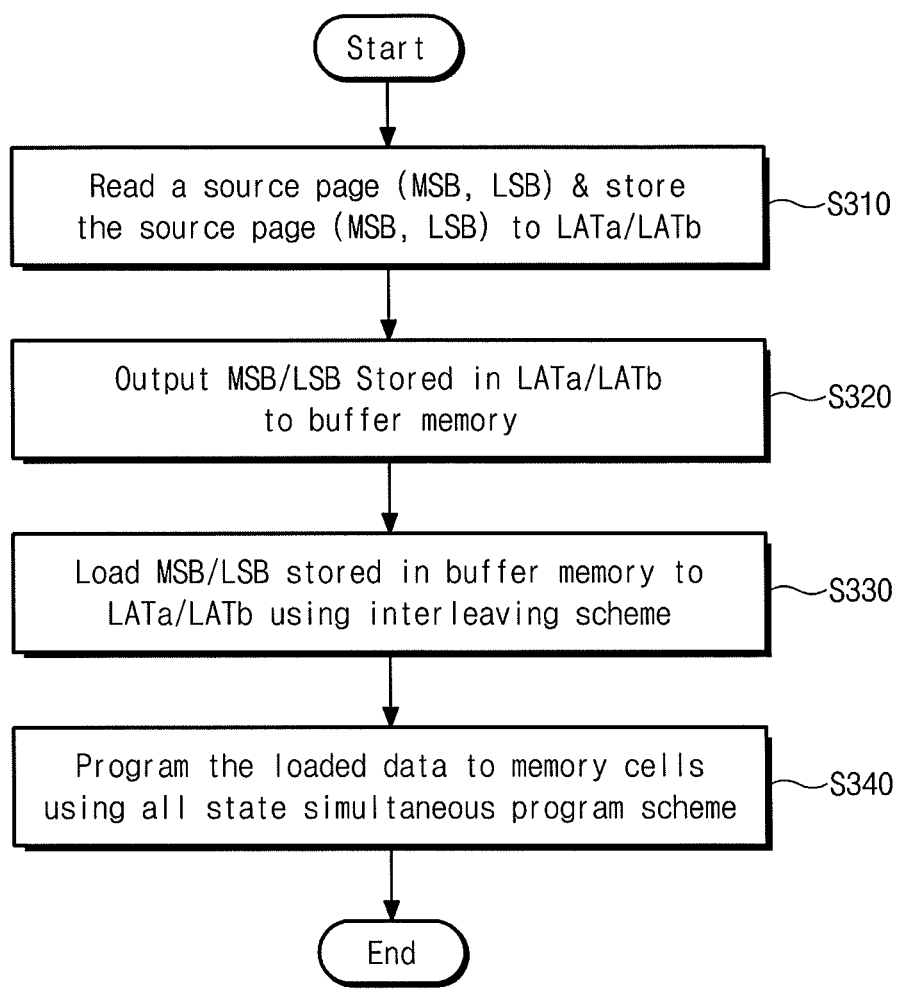
FIG. 16 illustrates a flowchart of a copyback self interleaving operation of the memory system of FIG. 15.

FIG. 16 illustrates a flowchart of a copyback self interleaving operation of the memory system of FIG. 15. Referring to FIGS. 15 and 16, a copyback self interleaving operation of the memory system according to an embodiment the will be described in order.

In operation S310, the flash memory 1100 read MSB and LSB data of a source page and stores them in the latches LATa and LATb. In operation S320, the MSB and LSB data stored in the latches LATa and LATb are output to the buffer memory 1250. In operation S330, the MSB and LSB data are divided by a sector unit and stored in the latches LATa and LATb using an interleaving scheme. As mentioned above, sectors may be obtained by dividing an IU of each logical page by a predetermined unit.

In operation S330, an operation may be performed as described with reference to FIGS. 8 and 9. That is, by generating a parity bit about the data stored in the buffer memory 1250 and using an interleaving scheme, the data and parity bit are stored in the latches LATa and LATb. In operation S340, the data stored in the latches LATa and LATb may be programmed into a target page simultaneously.

III. Application Example of Self Interleaving Method

Figure 17:
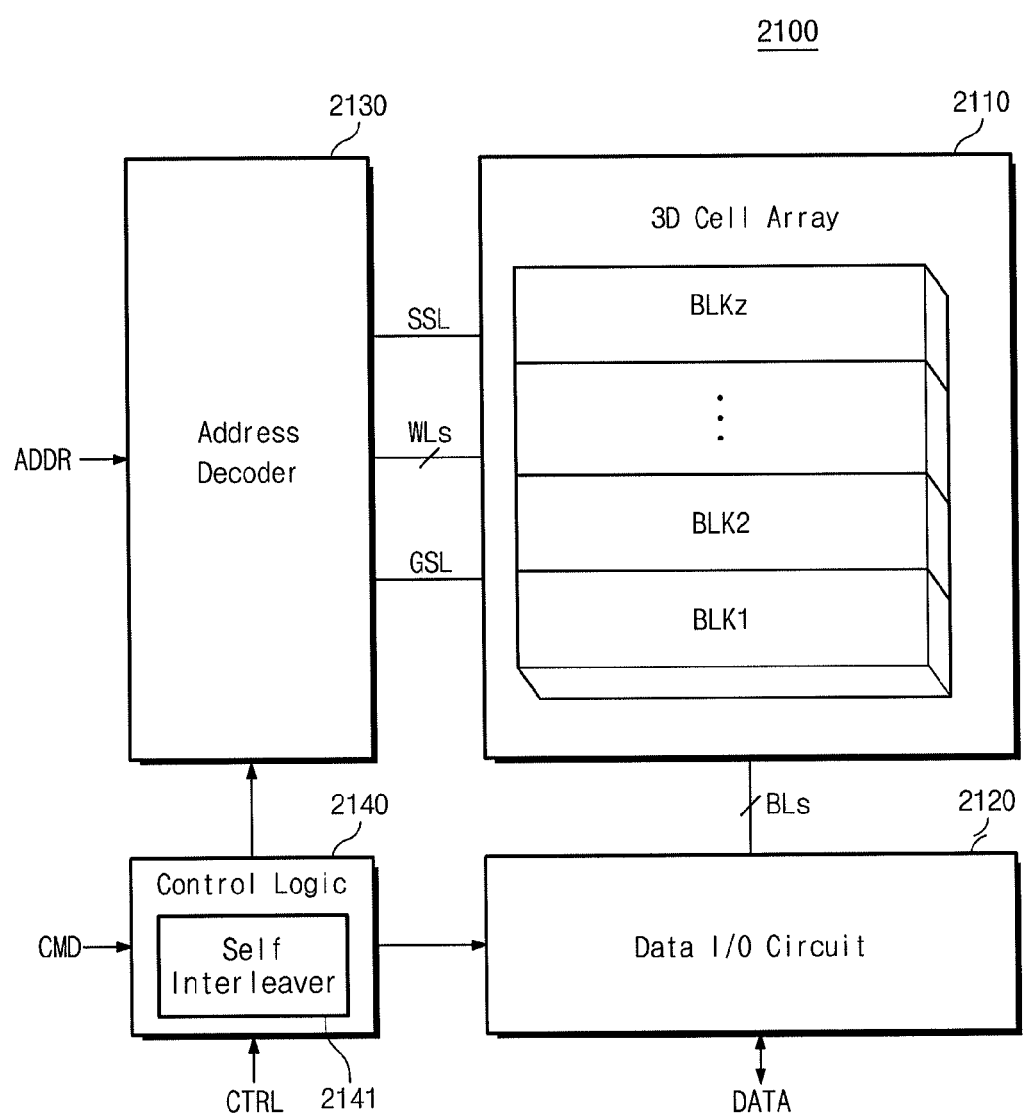
FIG. 17 illustrates a block diagram when a self interleaving method is applied to a three-dimensional flash memory according to an embodiment.

FIG. 17 illustrates a block diagram when a self interleaving method is applied to a three-dimensional flash memory according to an embodiment. Referring to FIG. 17, a flash memory 2100 includes a three-dimensional cell array 2110, a data input/output circuit 2120, an address decoder 2130, and a control logic 2140.

The three-dimensional array 2110 includes a plurality of memory blocks BLK1 to BLKz. Each memory block has a three-dimensional structure (or vertical structure). In a memory block having a three-dimensional structure, memory cells are formed in a direction vertical to a substrate. Each memory block constitutes an erase unit of the flash memory 2100.

The data input/output circuit 2120 is connected to the three-dimensional cell array through a plurality of bit lines BLs. The data input/output circuit 2120 may receive data DATA from the external or may output the data DATA read from the three-dimensional cell array 2110 to the external. The address decoder 2130 is connected to the three-dimensional cell array 2110 through a plurality of word lines WLs and selection lines GSL and SSL. The address decoder 2130 may receive an address ADDR and selects a word line.

The control logic 2140 includes a self interleaver 2141. The self interleaver 2141 performs an interleaving operation by itself, being separated from the memory controller 1200 of FIG. 1.

Figure 18:
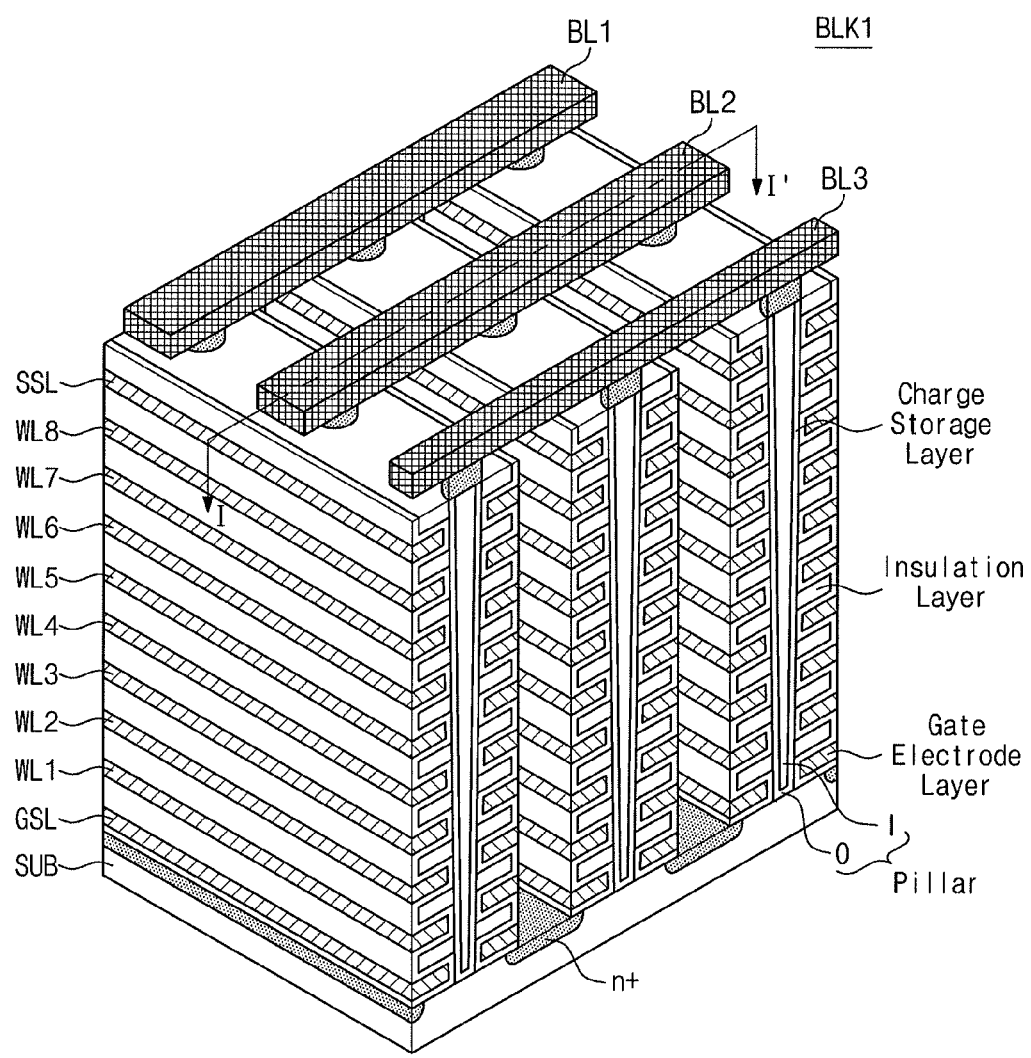
FIG. 18 illustrates a perspective view of a three-dimensional structure of the memory block BLK1 of FIG. 17.

FIG. 18 illustrates a perspective view of a three-dimensional structure of the memory block BLK1 of FIG. 17. Referring to FIG. 18, the memory block BLK1 is formed in a direction vertical to a substrate SUB. An n+ doping region is formed in the substrate SUB. A gate electrode layer and an insulation layer are alternately deposited on the substrate SUB. A charge storage layer may be formed between the gate electrode layer and the insulation layer.

A V-shaped pillar is formed by vertically patterning the gate electrode layer and the insulation layer. The pillar is connected to the substrate SUB through the gate electrode layer and the insulation layer. The outer portion O of the pillar may consist of a channel semiconductor, and the inner portion I may consist of an insulation material such as a silicon oxide.

Referring still to FIG. 18, the gate electrode layer of the memory block BLK1 may be connected to a ground selection line GSL, a plurality of word lines WL1 to WL8, and a string selection line SSL. The pillar of the memory block BLK1 may be connected to a plurality of bit lines BL1 to BL3. In FIG. 17, although it is shown that one memory block BLK1 includes two selection lines GSL and SSL, eight word lines WL1 to WL8, and three bit lines BL1 to BL3, the actual number of lines may vary.

Figure 19:
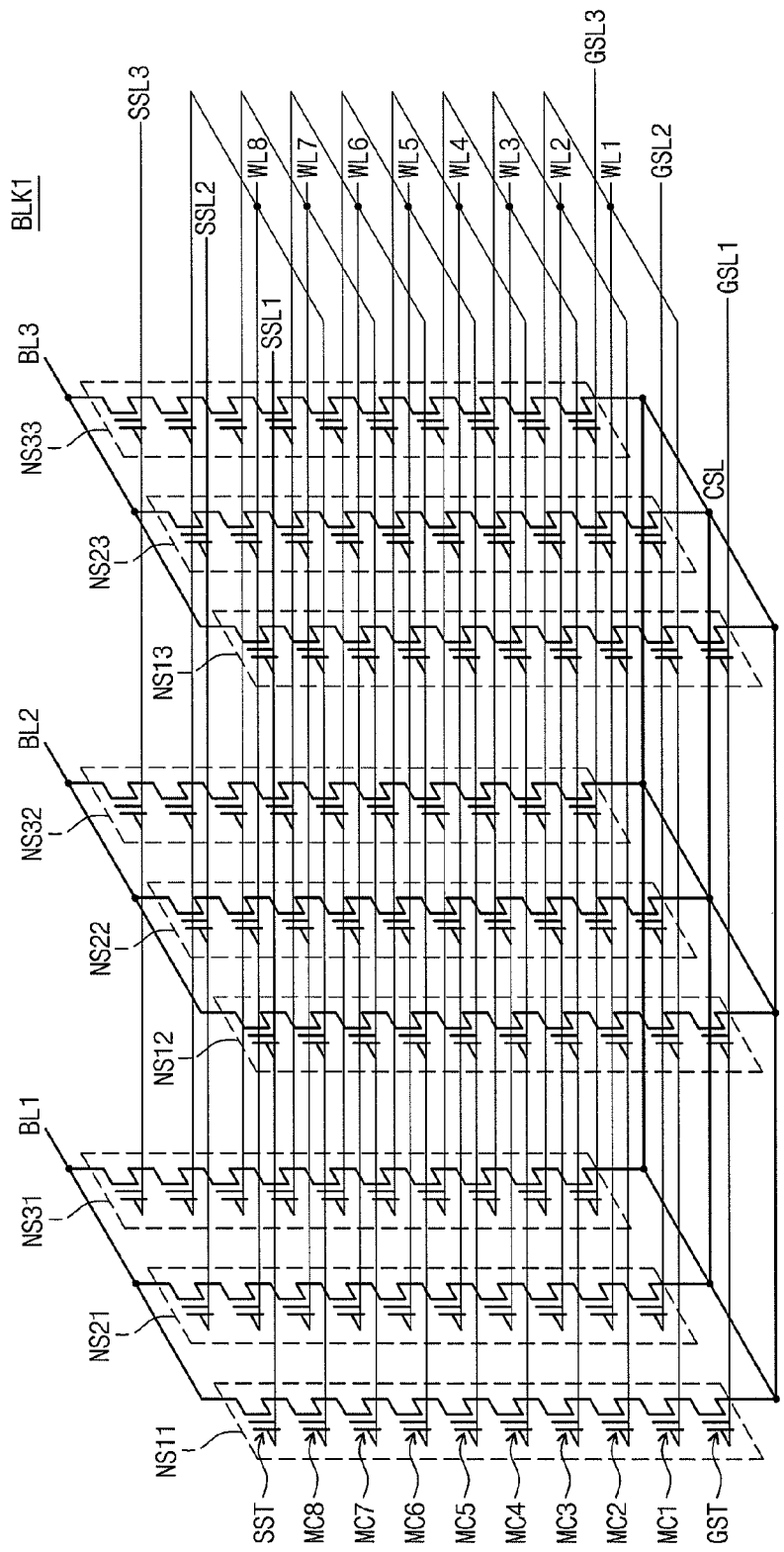
FIG. 19 illustrates an equivalent circuit diagram of the memory block BLK1 of FIG. 17.

FIG. 19 illustrates an equivalent circuit diagram of the memory block BLK1 of FIG. 17. Referring to FIG. 19, NAND strings NS11 to NS33 are connected between the bit lines BL1 to BL3 and the common source line CSL. Each NAND string (e.g., NS11) includes a string selection transistor SST, a plurality of memory cells MC1 to MC8, and a ground selection transistor GST.

The string selection transistor SST is connected to string selection lines SSL1 to SSL3. The plurality of memory cells MC1 to MC8 are connected to corresponding word lines WL1 to WL8, respectively. The ground selection transistor GST is connected to ground selection lines GSL1 to GSL3. The string selection transistor SST is connected to a bit line BL and the ground selection transistor GST is connected to a common source line CSL.

Referring still to FIG. 19, word lines having the same height (e.g., WL1) are commonly connected and the ground selection lines GSL1 to GSL3 and the string selection lines SSL1 to SSL3 are separated. If memory cells (hereinafter, referred to as a page) connected to the first word line WL1 and included in the NAND strings NS11, NS12, and NS13 are programmed, the first word line WL1 and the first selection lines SSL and GSL1 are selected.

Figure 20:
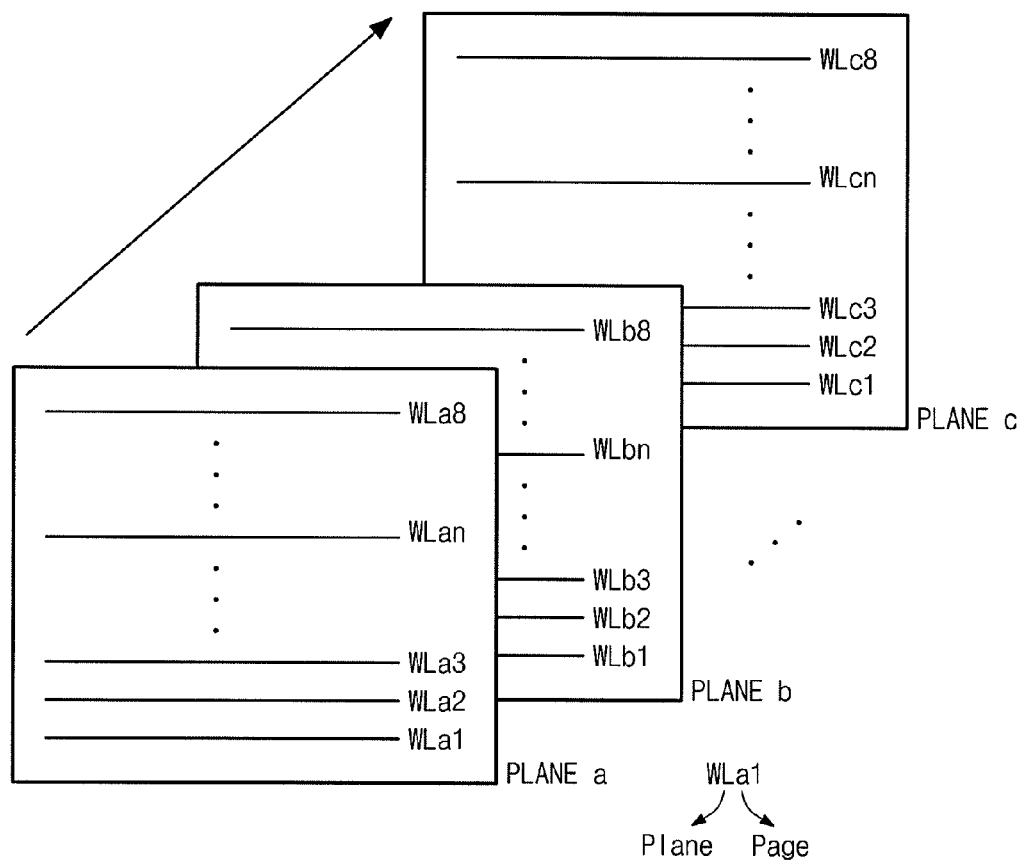
FIG. 20 illustrates a conceptual diagram of a plane structure of the equivalent circuit diagram of FIG. 19.

FIG. 20 illustrates a conceptual diagram of a plane structure of the equivalent circuit diagram of FIG. 19. Referring to FIG. 20, the memory block BLK1 of FIG. 19 consists of three planes. In FIG. 20, the NAND strings NS11, NS12, and NS13 constitute a plane PLANEa, the NAND strings NS21, NS22, and NS23 constitute a plane PLANEb, and the NAND strings NS31, NS32, and NS33 constitute a plane PLANEc. WL1 is divided into WLa1, WLb1, and WLc1, and WL2 is divided into WLa2, WLb2, and WLc2. In the same manner, WLn is divided into WLan, WLbn, and WLcn.

A program order may vary. For example, a program operation may be sequentially performed from PLANEa to PLANEc. In each plane, a program operation may be sequentially performed from WL1 to WL8. Moreover, as shown in FIG. 20, at least one plane may be further included between PLANEb and PLANEc.

Referring to FIG. 17, the flash memory 2100 may perform an interleaving operation by itself using the self interleaver 2140. The interleaving operation is performed through the above-described method.

The memory system according to an embodiment may be applied to various products. The memory system may be realized with an electronic device (such as a personal computer, a digital camera, a camcorder, a mobile phone, an MP3, a PMP, a PSP, and a PDA) and a storage device (such as a memory card, a USB memory, and a solid state drive (SSD).

Figure 21:
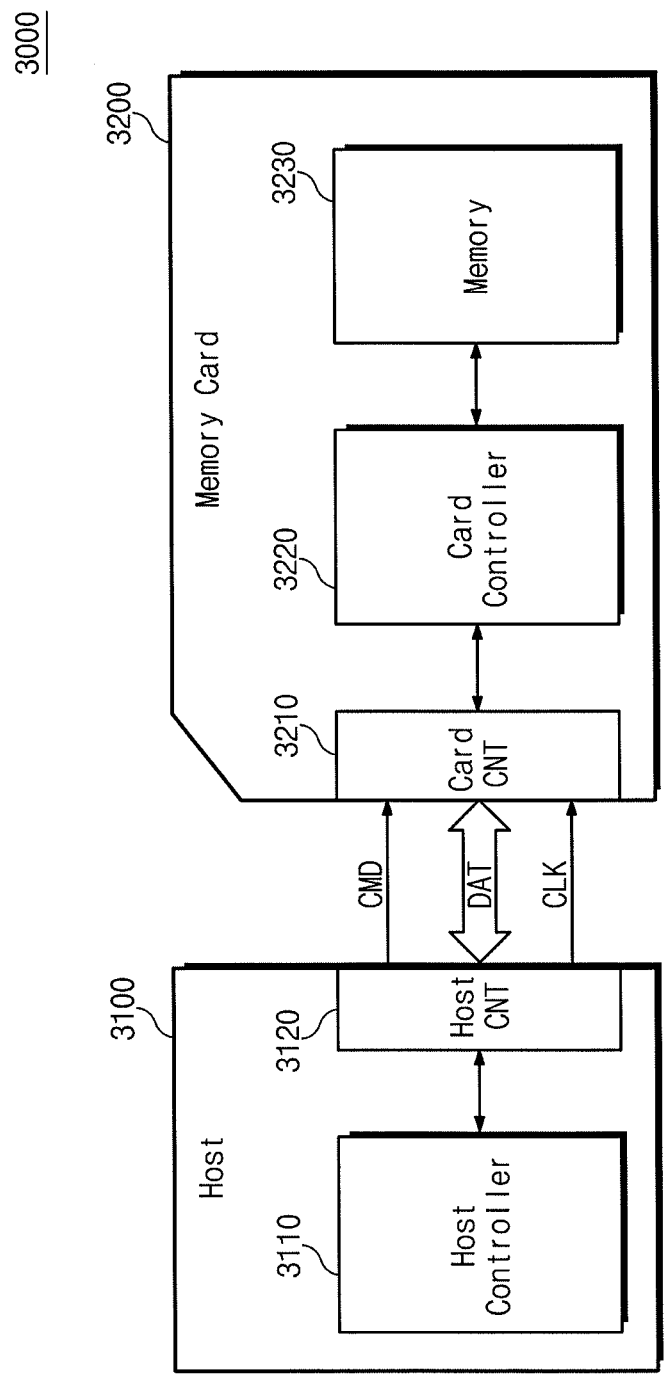
FIG. 21 illustrates a view of a flash memory system applied to a memory card according to an embodiment.

FIG. 21 illustrates a view when a flash memory system is applied to a memory card according to an embodiment. A memory card system 3000 includes a host 3100 and a memory card 3200. A host 3100 includes a host controller 3110 and a host connection unit 3120. The memory card 3200 includes a card connection unit 3210, a card controller 3220, and a flash memory 3230.

The host 3100 may write data in the memory card 3200 and may read the data stored in the memory card 3200. The host controller 3110 may transmit a command (e.g., a write command), a clock signal CLK generated by a clock generator (not shown) in the host 3100, and data DATA to the memory card 3200 through the host connection unit 3120.

The card controller 3220 stores the data in the flash memory device 3230 in response to the write command received through card connection unit 3210, being synchronized with a clock signal generated by a clock generator (not shown) in the card controller 3220. The flash memory 3230 stores data transmitted from the host 3100. For example, if the host 3100 is a digital camera, the flash memory 3230 stores image data.

The memory card 3200 of FIG. 21 may reduce BER disproportion between logical pages of the flash memory 3230 through a self-interleaving method. The self interleaving method is performed as described above.

Figure 22:
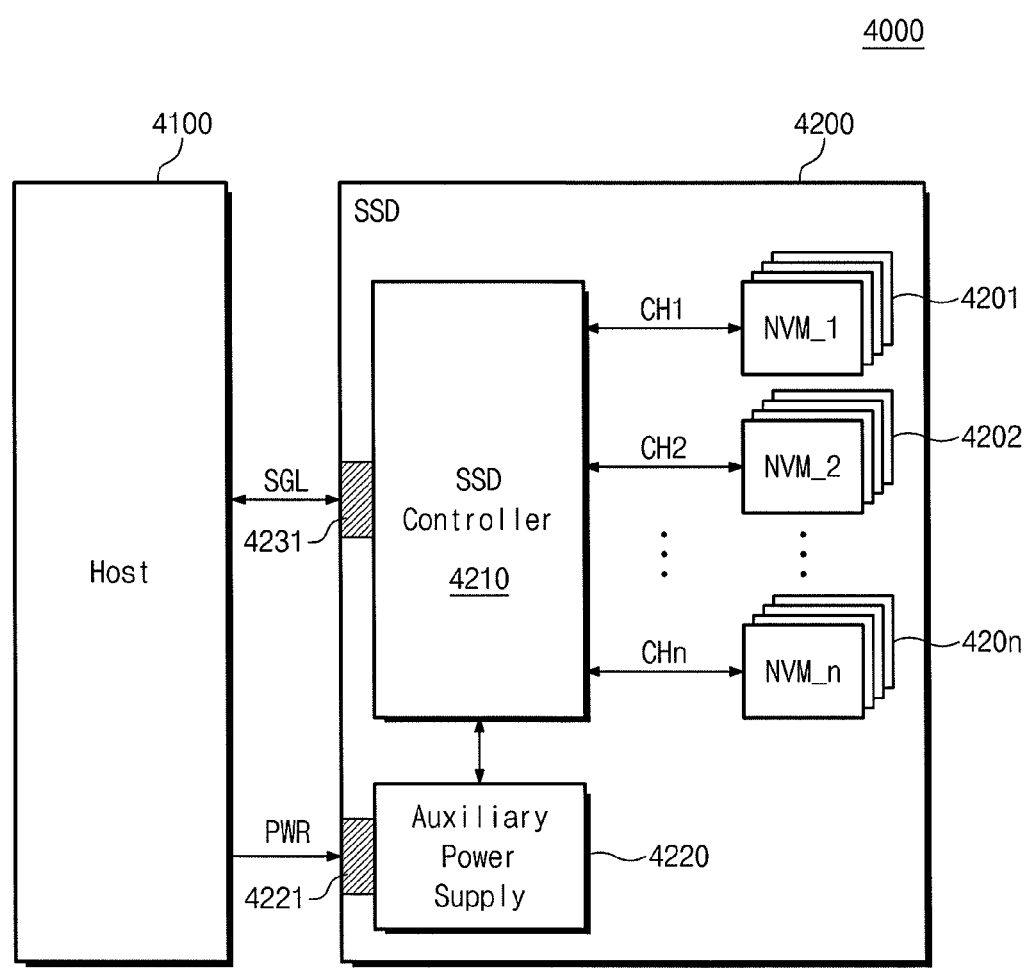
FIG. 22 illustrates a block diagram when a memory system is applied to a SSD according to an embodiment.

FIG. 22 illustrates a block diagram when a memory system is applied to a SSD according to an embodiment. Referring to FIG. 22, a SSD system 4000 includes a host 4100 and a SSD 4200.

The SSD 4200 exchanges a signal with a host 4100 through a signal connector 4211, and receives power through a power connector 4211. The SSD 4200 may include a plurality of flash memories 4201 to 420n, an SSD controller 4210, and an auxiliary power device 4220.

The plurality of flash memories 4201 to 420n are used as a storage medium. The SSD 4200 may use nonvolatile memory device such as PRAM, MRAM, ReRAM, and FRAM besides a flash memory. The plurality of flash memories 4201 to 420n may be connected to the SSD controller 4210 through a plurality of channels CH1 to CHn. At least one flash memory may be connected to one channel. A flash memory connected to one channel may be connected to the same data bus.

The SSD controller 4210 exchanges a signal SGL with the host 4100 through the signal connector 4211. Here, the SGL may include a command, an address, and data. The SSD controller 4210 writes data in a corresponding flash memory or reads data from a corresponding flash memory according to a command of the host 4100. An inner configuration of the SSD controller 4210 will be described in more detail with reference to FIG. 21.

The auxiliary power device 4220 is connected to the host 4100 through the power connector 4221. The auxiliary power device 4220 receives power PWR from the host 4100 and charges it. In addition, the auxiliary power device 4220 may be placed in or outside the SSD 4200. For example, the auxiliary power device 4220 may be placed in a main board and may provide auxiliary power to the SSD 4200.

Figure 23:
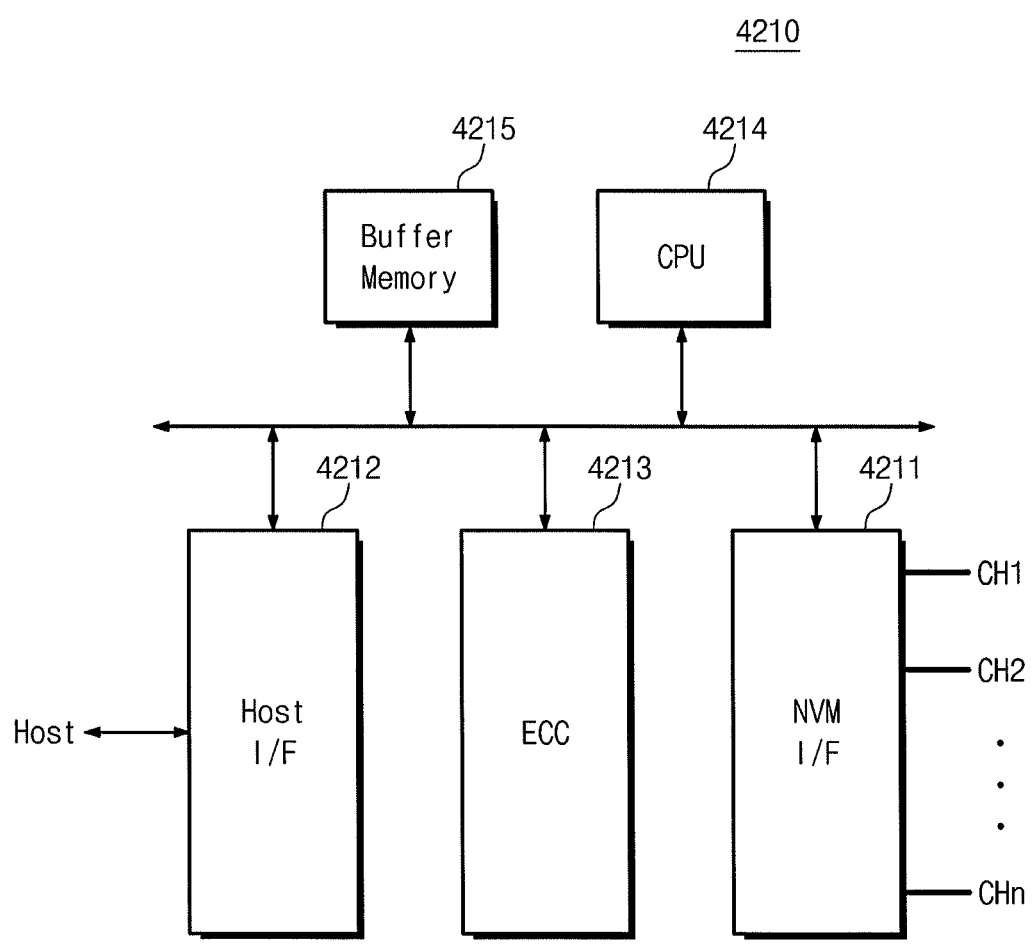
FIG. 23 illustrates a block diagram of a configuration of the SSD controller 4210 of FIG. 22.

FIG. 23 illustrates a block diagram of a configuration of the SSD controller 4210 of FIG. 22. Referring to FIG. 23, the SSD controller 4210 includes an NVM interface 4211, a host interface 4212, an ECC circuit 4213, a central processing unit (CPU) 4214, and a buffer memory 4215.

The NVM interface 4211 scatters data delivered from the buffer memory 4215 into the respective channels CH1 to CHn. Moreover, the NVM interface 4211 delivers the data read from the flash memories 4201 to 420n into the buffer memory 4215. Here, the NVM interface 4211 may use an interface method of a flash memory. That is, the SSD controller 4210 may perform a program, read, or erase operation according to a flash memory interface method.

The host interface 4212 provides an interface with the SSD 4200 according to a protocol of the host 4100. The host interface 4212 may communicate with the host 4100 through universal serial bus (USB), a small computer system interface (SCSI), a PCI express, ATA, a parallel ATA (PATA), a serial ATA (SATA), and a serial attached SCSI (SAS). Moreover, the host interface 4212 may perform disk emulation for supporting the host 4100 to recognize a SSD as a hard disk drive (HDD).

The ECC circuit 4213 generates a parity bit of an error correction code (ECC) by a code word unit using data transmitted to the flash memories 4201 to 420n. The generated parity bit is stored in a spare area of the flash memories 4201 to 420n. The ECC circuit 4213 detects an error of the data read from the flash memories 4201 to 420n. If the detected error is within a correctible range, the ECC circuit 4213 corrects the detected error.

The CPU 4214 analyzes and processes the signal SGL from the host 4100 of FIG. 22. The CPU 4214 controls the host 4100 or the flash memories 4201 to 420n through the host interface 4212 or the NVM interface 4211. The CPU 4214 controls operations of the flash memories 4201 to 420n according to a firmware for driving the SSD 4200.

The buffer memory 4215 temporarily stores write data provided from the host 4100 or data read from the flash memory. Moreover, the buffer memory 4215 may store meta data or cache data to be stored in the flash memories 4201 to 420n. During a sudden power off operation, the meta data or cache data stored in the buffer memory 4215 are stored in the flash memories 4201 to 420n. The buffer memory 4215 may include DRAM or SRAM. The SSD 4000 shown in FIGS. 21 and 22 may alleviate BER disproportion using a self interleaving method as described above.

Figure 24:
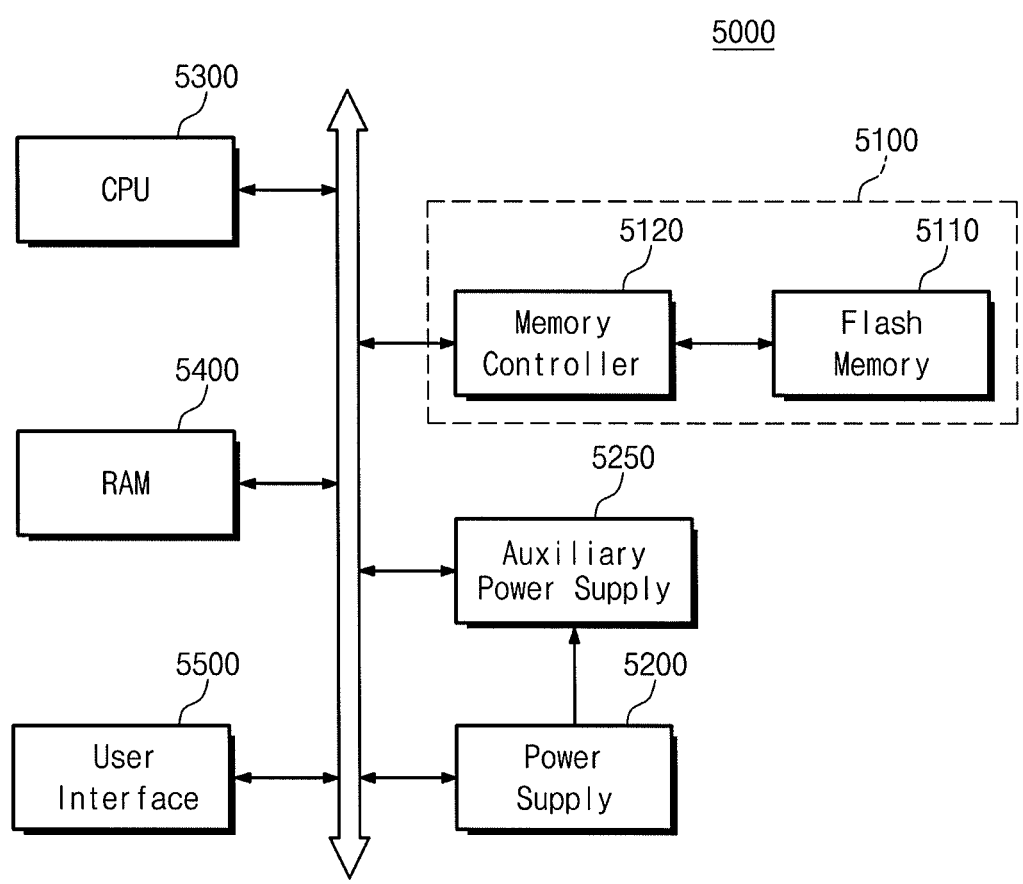
FIG. 24 illustrates a block diagram when a flash memory system is realized with an electronic device according to an embodiment.

FIG. 24 illustrates a block diagram when a flash memory system is realized with an electronic device according to an embodiment. Here, the electronic device 5000 may be realized with a personal computer (PC) or a portable electronic device such as a notebook computer, a mobile phone, a personal digital assistant (PDA), and a camera.

Referring to FIG. 24, the electronic device 5000 includes a memory system 5100, a power device 5200, an auxiliary power device 5250, a CPU 5300, a RAM 5400, and a user interface 5500. The memory system 5100 includes a flash memory 5110 and a memory controller 5120. The memory system 5100 may alleviate BER disproportion using a self interleaving method as described above.

By way of summary and review, according to embodiments, self-interleaving may be used to reduce a difference in BER between sectors. For example, pages in different sectors may be reallocated, i.e., mixed, amongst the sectors such that the BER for each sector is the same, e.g., an average of the BER across sectors. Thus, according to embodiments, BER disproportion may be alleviated, a load of an ECC circuit may be reduced, and a size of a buffer memory may be reduced.

As described above, the self interleaving may be implemented with hardware such as modules, or software such as algorithm or firmware. The algorithm or firmware may be embodied as computer readable codes and/or programs on a computer readable recording medium. The programming method of the nonvolatile memory device using interleaving technology according to some embodiments may be embodied by executing the computer program for executing the programming method of the nonvolatile memory device stored in the computer readable recording medium.

The computer readable recording medium is any data storage device that can store data which can be thereafter read by a computer system. More particularly, the computer readable recording medium may be, e.g., a tangible, non-transitory recording medium. Examples of the computer readable recording medium include read-only memory (ROM), random-access memory (RAM), CD-ROMs, magnetic tapes, floppy disks, and optical data storage devices. The program codes for executing a method of upgrading an operation program in an RFID system may be transmitted in the form of carrier waves (such as data transmission through the Internet).

The computer readable recording medium can also be distributed over network coupled computer systems so that the computer readable code is stored and/or executed in a distributed fashion. Also, functional programs, codes, and/or code segments for realizing embodiments can be easily construed by programmers skilled in the art to which the embodiments pertain.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory device, comprising:
   a memory cell array;
   a self interleaver configured to interleave and load data on the fly into a buffer circuit using an interleaving scheme; and
   a control logic configured to control programming of the interleaved data in the memory cell array, wherein:
   the memory cell array includes a plurality of physical pages each capable of storing a plurality of logical pages;
   the self interleaver is configured to divide each logical page into a plurality of sectors and to perform the interleaving scheme by mixing sectors of the respectively different logical pages; and
   the control logic controls programming of the plurality of intermixed logical pages in a physical page of the memory cell array.

2. The memory device as claimed in claim 1, wherein the control logic includes the self interleaver.

3. The memory device as claimed in claim 1, wherein data is received from outside the memory device.

4. The memory device as claimed in claim 1, wherein the buffer circuit stores data by sectors.

5. The memory device as claimed in claim 4, wherein the buffer circuit includes a plurality of page buffers storing the sectors in response to enable signals and selection signals output from the self interleaver.

6. The memory device as claimed in claim 5, wherein each page buffer includes a plurality of latches, each latch storing one bit in response to a corresponding enable signal and corresponding selection signals output from the self interleaver.

7. The memory device as claimed in claim 6, wherein the self interleaver is configured to interleave and load data into the buffer circuit by sector unit.

8. The memory device as claimed in claim 5, further comprising:
   a column selection circuit selecting a page buffer of the buffer circuit; and
   a data buffer providing data received from outside the memory device into the column selection circuit.

9. The memory device as claimed in claim 8, wherein the self interleaver is configured to control the buffer circuit and the column selection circuit to interleave and load data.

10. The memory device as claimed in claim 5, wherein data is from a source page of the memory cell array and wherein the control logic is configured to control programming of the interleaved data to a target page in the memory cell array using interleaving.

11. The memory device as claimed in claim 10, wherein the self interleaver is configured to sequentially store n-bit data from the source page in a first page buffer of the buffer circuit, to transfer the source page data to a data buffer, and to interleave and load the source page data on the fly into n latches from the first page buffer.

12. The memory device as claimed in claim 10, wherein the self interleaver is configured to store data from the source page in the buffer circuit, to transfer the source page data to a circuit external to the memory device, the circuit further processing the source page data, and to interleave and load the source page data on the fly from the external circuit into the buffer circuit, and to control programming of the interleaved data to the target page of the memory cell array.

13. The memory device as claimed in claim 10, wherein the self interleaver is configured to store data from the source page and data from outside the memory device in the buffer circuit, and to interleave and load the source page data and the data from outside on the fly into the buffer circuit, and to control programming of the interleaved data to the target page of the memory cell array.

14. The memory device as claimed in claim 1, wherein the plurality of logical pages stored in the buffer circuit are programmed by an all state simultaneous program scheme.

15. The memory device as claimed in claim 1, wherein the self interleaver is configured to determine a size of an individual sector.

16. The memory device as claimed in claim 1, wherein interleaved data have a bit error rate equal to an average bit error rate of the plurality of sectors.

17. The memory device as claimed in claim 1, wherein each physical page is divided into a main area and a spare area.

18. The memory device as claimed in claim 1, wherein the memory cell array has a three-dimensional structure.

19. The memory device as claimed in claim 1, wherein the memory cell array is a flash memory cell array.

20. A memory system, comprising:
a memory device as recited in claim 1; and
a memory controller configured to control an operation of the memory device.

21. The memory system as claimed in claim 20, wherein the memory system is a system on chip.

22. The memory system as claimed in claim 20, further comprising an error correction code circuit.

23. The memory system as claimed in claim 22, wherein the error correction code circuit is part of the memory controller.

24. The memory system as claimed in claim 22, wherein the error correction code circuit is separate from the memory controller.

25. The memory system as claimed in claim 22, wherein the error correction code circuit is designed for an average bit error rate of logical pages to be stored in the memory cell array.

26. The memory system as claimed in claim 20, further comprising:
a host; and
a communication device configured to exchange data between the host and the memory device.

27. The memory system as claimed in claim 20, further comprising a plurality of memory devices as recited in claim 1.

28. The memory system as claimed in claim 20, wherein the memory device is part of a memory card.

29. The memory system as claimed in claim 20, wherein the memory device is part of a solid state drive.

30. The memory system as claimed in claim 20, wherein the memory device is a flash memory device.

31. An electronic device including the memory system recited in claim 20.

32. A method of operating a memory device, comprising:
receiving data;
interleaving and loading received data on the fly into a buffer circuit using an interleaving scheme; and
programming the interleaved data in a memory cell array of the memory device, wherein the memory cell array includes a plurality of physical pages each capable of storing a plurality of logical pages, and wherein the method further comprises:
dividing each of the plurality of logical pages into a plurality of sectors,
intermixing sectors of different ones of the logical pages; and
programming the intermixed logical pages in one or more of the physical pages of the memory cell array.

33. The method as claimed in claim 32, wherein receiving data includes receiving data from outside the memory device.

34. The method as claimed in claim 32, wherein receiving data further includes receiving data from inside the memory device.

35. The method as claimed in claim 32, wherein receiving data includes receiving data from a source page of the memory cell array and wherein programming includes programming the interleaved data to a target page in the memory cell array.

36. The method as claimed in claim 32, wherein receiving data includes receiving data from a source page of the memory cell array and receiving data from outside the memory device, wherein interleaving and loading includes mixing data from the source page and data from outside, wherein programming includes programming the interleaved data to a target page in the memory cell array.

37. The method as claimed in claim 32, wherein interleaving and loading includes determining a data size of a sector to be interleaved before intermixing the sectors of different ones of the logical pages.

38. The method as claimed in claim 37, wherein a bit error rate of interleaved data equals an average bit error rate of the plurality of sectors.

39. The method as claimed in claim 32, further comprising, before programming, determining whether all data has been loaded into the buffer circuit.

40. The method as claimed in claim 39, wherein, when all data has been loaded into the buffer circuit, programming includes using an all state simultaneous program scheme.

41. The method as claimed in claim 39, wherein, when all data has not been loaded into the buffer circuit, repeating receiving, and interleaving and loading.

42. The method as claimed in claim 32, wherein the memory cell array is a flash memory cell array.

* * * * *